United States Patent
Kagami et al.

(10) Patent No.: US 6,567,230 B1
(45) Date of Patent: May 20, 2003

(54) METHOD AND SYSTEM FOR PERFORMING POSITIONING CONTROL OF A HEAD ACTUATOR IN A DISK DEVICE UTILIZING A DIGITAL FILTER

(75) Inventors: Naoyuki Kagami, Fujisawa (JP); Akira Tokizono, Fujisawa (JP); Sri M. Sri-Jayantha, Ossining, NY (US); Tatsuya Sakai, Yamato (JP); Isao Yoneda, Yokohama (JP); Hien Phu Dang, Nanuet, NY (US); Arun Sharma, New Rochelle, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/429,696

(22) Filed: Oct. 28, 1999

(30) Foreign Application Priority Data

Oct. 29, 1998 (JP) .......................... 10-308923

(51) Int. Cl.[7] .......................... G11B 21/02; G11B 5/035
(52) U.S. Cl. .......................... 360/75; 360/65
(58) Field of Search .......................... 360/75, 65, 39, 360/20, 23; 364/724.19, 724.01; 708/300–303

(56) References Cited

U.S. PATENT DOCUMENTS

| | | | | |
|---|---|---|---|---|
| 3,665,171 A | * | 5/1972 | Morrow | 708/319 |
| 5,245,262 A | * | 9/1993 | Moody et al. | 318/560 |
| 5,245,565 A | * | 9/1993 | Petersen et al. | 360/65 |
| 5,268,625 A | * | 12/1993 | Plummer | 318/560 |
| 5,654,909 A | * | 8/1997 | Sun | 708/300 |
| 5,786,951 A | * | 7/1998 | Welland et al. | 360/46 |
| 5,841,681 A | * | 11/1998 | Chen et al. | 324/76.31 |
| 5,856,934 A | * | 1/1999 | Nakajima et al. | 708/300 |
| 6,377,418 B1 | * | 4/2002 | Kagami et al. | 360/39 |

* cited by examiner

Primary Examiner—David Hudspeth
Assistant Examiner—K. Wong
(74) Attorney, Agent, or Firm—Randall J. Bluestone; Bracewell & Patterson, L.L.P.

(57) ABSTRACT

A method and system for utilizing a digital filter for actuator positioning control in a disk device. In accordance with the method and system of the present invention multiple selectable filter modules are provided. Each of the multiple selectable filter modules functions in a serial or parallel filtering mode when selected. Multiple configurable registers are also provided wherein the configuration of each of the multiple configurable registers determines a selection of at least one of the multiple selectable filter modules. Particular ones of the multiple configurable registers are selected, such that a configuration of the digital filter is dynamically selectable in order to achieve a predetermined filter output.

20 Claims, 13 Drawing Sheets

PEAK/NOTCH DIGITAL FILTERS

| 0570 | F0_MODE |
|------|---------|
| 0572 | F1_MODE |
| 0574 | F2_MODE |
| 0576 | F3_MODE |
| 0578 | F4_MODE |
| 057A | F5_MODE |
| 057C | F6_MODE |

*Fig. 7*

[F0_MODE], [F1_MODE], [F2_MODE], [F3_MODE], [F4_MODE], [F5_MODE], [F6_MODE]

Fn_MODE : xxxx xxxx xxxx xxxx
                              |
                              0 : PEAK FILTER
                              1 : NOTCH FILTER

*Fig. 8*

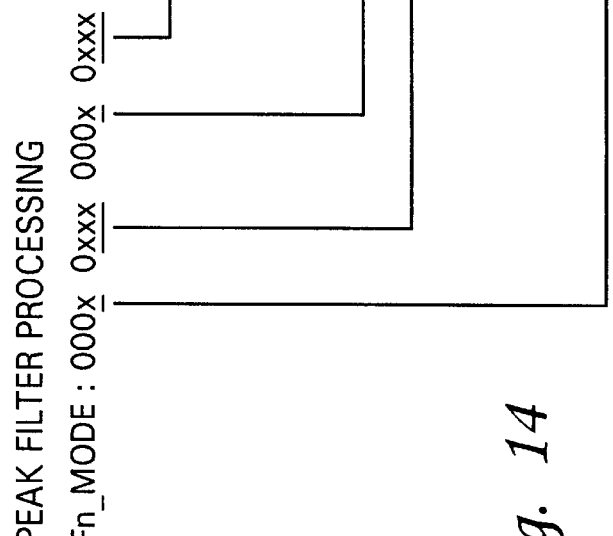

Fig. 13

PEAK FILTER

| 055E | CALCOUT1 |
| 0560 | CPE |
| 057E | ST_VALUE |
| 00EE | ST_TIME |

PEAK FILTER PROCESSING

Fn_MODE : 000x 0xxx 000x 0xxx

- OSHCNT : OUTPUT data left shift count
  - 000 → Right 2 bit shift of standard position
  - 010 → Standard position
  - 111 → Left 5 bit shift of standard position
- ENABLE : PFn_OUT addition enable to CALCOUT1
- ISHCNT : INPUT data right shift count
  - 000 → Left 2 bit shift of standard position
  - 010 → Standard position
  - 111 → Right 5 bit shift of standard position
- STSEL : SELF_TUNING filter input select
  - 0 → CPE
  - 1 → ST_VALUE x ST_TGL

Fig. 14

| TOGGLE FREQUENCY | ST_TIME |
|---|---|
| 400[Hz] | 62499 (F423 h) |
| 425[Hz] | 58823 (E5C7 h) |
| 450[Hz] | 55555 (D903 h) |
| : | : |
| 9975[Hz] | 2505 (09C9 h) |
| 10000[Hz] | 2499 (09C3 h) |
| ST_TGL is always '1' when ST_TIME=0 | |

NOTCH FILTER

| 0590 | NF1_K |
| 0592 | NF1_E |
| 0594 | NF1_F |
| 0596 | NF1_B |
| 0598 | NF1_C |
| 059A | NF1_U1 |
| 059C | NF1_U2 |
| 059E | NF1_OUT |

| 05Ax | NF2_xxx |
| 05Bx | NF3_xxx |
| 05Cx | NF4_xxx |
| 05Dx | NF5_xxx |
| 05Ax | NF6_xxx |

DACOUT CALCULATION

| 0548 | OFFSETL |
| 054A | OFFSETU |
| 0550 | K1 |
| 0552 | K2 |
| 0554 | K3 |
| 0556 | K4 |
| 0558 | K5 |
| 055A | K6 |
| 055C | Ki |
| 055E | CALCOUT1 |

| 0560 | CPE |
| 0562 | CVE |
| 0564 | U1 |
| 0566 | U2 |
| 0568 | PVE |
| 056A | U3 |
| 056C | SPE |

DEVIATION PREDICTION

| 0518 | KN |
| 051A | KX |
| 051C | PWAC |
| 05F8 | PPWA_VALUE |

METHOD AND SYSTEM FOR PERFORMING POSITIONING CONTROL OF A HEAD ACTUATOR IN A DISK DEVICE UTILIZING A DIGITAL FILTER

BACKGROUND OF THE INVENTION

1. Technical Field

The present invention relates in general to a disk drive device and, in particular, to an improved method and system for performing positioning control of a head actuator in a disk device. Still more particularly, the present invention relates to a method and system for o optimizing the performance of head actuator control of disk devices of different sizes, having different characteristics, utilizing a multi-purpose programmable digital filter to perform servo control.

2. Description of the Prior Art

Greater miniaturization and reliability are being demanded in hard disk drives (HDDs) utilized as external storage devices in information-processing equipment.

As depicted in FIG. 2, concentric recording tracks X2 are formed on the recording surface of a magnetic disk utilized as a recording medium in a fixed disk device. Servo areas X3, in which a servo pattern, ID, and the like are recorded at constant angles, are provided at certain angles in recording tracks X2. Data areas X4, in which data sectors X5 are recorded at a constant angular velocity, are provided between adjacent servo areas X3. In some fixed disk devices of this type, these data areas X4 are divided into several areas (zones) in the radial direction, and the number of data sectors X5 recorded in each zone is made responsive to the radial position to produce a more uniform recording density.

In these fixed disk devices, when a sector is specified and recording or reproduction is commanded, seek control is performed to move a head X6 to the track in which the sector to be recorded or reproduced is recorded (the target track). After head X6 has reached the target track, following control is carried out to adjust the position of head X6 so that head X6 follows the track.

A disk drive device possesses a hard disk controller (HDC) X9 that moves a head arm X7 according to an error between the present position of head X6 and the target track, thereby carrying out servo control, such as seek control and following control.

As depicted in FIG. 3, a disk servo pattern (WEDGE-A, WEDGE-B, WEDGE-C, WEDGE-D) and an ID (CYLID) are recorded in servo area X3; when head X6 passes over these, the reproduced outputs of the servo pattern and ID, reproduced by head X6, are supplied to HDC X9. When supplied with these reproduced outputs, HDC X9 determines from them the present position of head X6, and finds the error (track displacement) with respect to the target track. Upon determining the track displacement, HDC X9 determines data (DACOUT value) therefrom for driving a voice coil motor (VCM) X8 that moves head arm X7.

In seek control, HDC X9 determines the difference between the present position of head X6 and the position of the target sector (the track displacement), and carries out control in response to this track displacement.

When a target track is designated, first, control is executed to accelerate head X6 toward the target sector. Next, when the velocity of motion of head X6 reaches a certain velocity, HDC X9 executes control to move head X6 at a constant velocity. Finally, when head X6 reaches the vicinity of the target sector, control (settling control) is executed to decelerate head X6.

When head X6 reaches the target track, there is a switchover to following control to make head X6 follow the target track. These control switchovers are carried out by changing parameters of the calculations that determine the DACOUT values.

Components of resonant frequencies of the actuator system, including head arm X7, are included in the DACOUT values determined as described above, however, and there have been cases in which, when VCM X8 was driven directly according to these types of DACOUT values during seeking, positioning control of the head became unstable. Efforts have been made to stabilize servo control by reducing the resonant frequency components of the DACOUT values by inserting a notch filter with a notch characteristic to suppress mechanical resonances, as depicted in U.S. Pat. No. 5,325,247, for example. A plurality of mechanical resonances can be dealt with in this way by coupling a plurality of notch filters in series.

If the pass characteristic is flat on the low side, then control may fail to stabilize during track following, because of disk eccentricity, disturbances, and the like. Efforts have therefore been made to stabilize control by calculating a narrow-band peak filter in parallel with servo control and adding the peak filter to the output to deal with low-frequency disturbances arising from disk-shift, unbalance, and the like, as described in U.S. Pat. No. 5,608,586, for example.

To realize this type of control, multiple filters with different characteristics were provided in fixed disk devices, and the filters to be utilized were selected according to the operating mode, or the operation of each filter was controlled.

There have been problems, however, in this conventional type of disk device. In particular, to control the head actuators of disk devices of different sizes, having different characteristics, it is necessary to design logic including filter characteristics for the particular hardware, because the characteristics of the filters needed in each type of disk device, such as peak filters for disturbance suppression and notch filters for mechanical resonance suppression, differ. For example, with the small actuators employed in hard disks with a form factor of one inch or less, the resonant frequencies become extremely high, and it becomes less necessary to insert the above-mentioned notch filters in series, but the disk becomes extremely thin, and the problem of repeatable disturbances due to disk eccentricity, warping, and the like arises.

Also, to realize control, it was necessary to provide complex data tables, by a microprocessor, or by a tester that tested the drive, to identify the mechanical resonant frequencies and adjust the filter coefficients. In real time, self-tuning the filter coefficients was difficult.

It should therefore be apparent that it would be preferable to provide a digital filter, a servo control device, and a disk drive device in which the filter configuration can be altered according to purpose, and disturbance suppression and mechanical resonance suppression can be effectively carried out.

Further, it is preferable to provide a digital filter, a servo control device, and a disk drive device that can easily generate variable-frequency noise for measuring frequency characteristics, and can measure actuator frequency characteristics in real time.

SUMMARY OF THE INVENTION

In view of the foregoing, it is therefore an object of the present invention to provide an improved disk drive device.

It is another object of the present invention to provide an improved method and system for performing positioning control of a head actuator in a disk device It is yet another object of the present invention to provide and improved method and system for optimizing the performance of head actuator control of disk devices of different sizes, having different characteristics, utilizing a multipurpose programmable digital filter to perform servo control.

In accordance with the method and system of the present invention multiple selectable filter modules are provided. Each of the multiple selectable filter modules functions in a serial or parallel filtering mode when selected. Multiple configurable registers are also provided wherein the configuration of each of the multiple configurable registers determines a selection of at least one of the multiple selectable filter modules. Particular ones of the multiple configurable registers are selected, such that a configuration of the digital filter is dynamically selectable in order to achieve a predetermined filter output.

All objects, features and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings wherein:

FIG. 7 is a block diagram of the mode select registers of the SA of FIG. 4;

FIG. 8 is a chart of the bit structure of the mode select registers of the SA of FIG. 4;

FIG. 13 is a block diagram of the registers utilized in the input/output processing of a peak filter;

FIG. 14 is chart of the bit structure of the Fn_MODE registers in peak filter processing;

DESCRIPTION OF A PREFERRED EMBODIMENT

Figure 1:
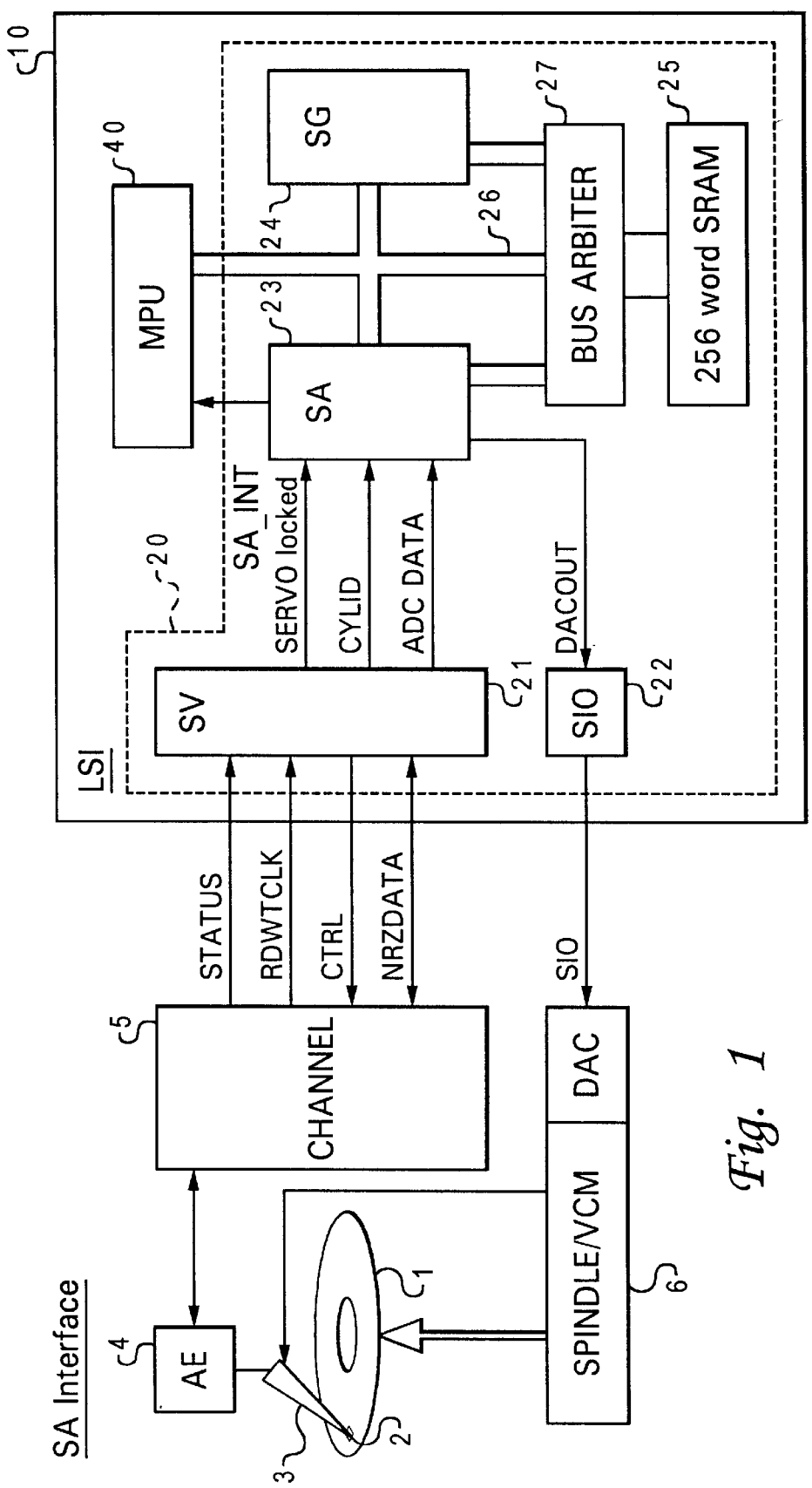
FIG. 1 is a block diagram of a disk drive device in accordance with a preferred embodiment of the present invention.

With reference now to the figures and in particular with reference now to FIG. 1, there is depicted a block diagram of a disk drive device according to an embodiment of the present invention. The disk drive device in FIG. 1 comprises a magnetic disk 1, such as a magnetic disk which is a data recording medium, a head 2 for recording and reproducing on magnetic disk 1, a head arm 3 to which head 2 is attached, and a head amp (AE) 4 disposed near head 2, that amplifies the signal reproduced by head 2. In addition, the disk drive device comprises a channel 5 that extracts a servo pattern, cylinder ID (CYLID), and the like from the reproduced output supplied through AE 4, and performs coding system conversion, etc. Also included in the disk drive device are an integrated HDC-MPU chip 10 that carries out control of recording and reproducing on magnetic disk 1, and a VCM driving unit 6 that drives a voice coil motor (VCM) that moves head arm 3.

Channel 5 is a read/write channel module in which a wave-shaping circuit, an analog-to-digital converter (ADC), a digital-to-analog converter (DAC), and the like are modularized.

VCM driving unit 6 comprises a voice coil motor (VCM) that swivels arm 3, a spindle motor driver for driving a spindle motor, a VCM driver for driving the voice coil motor (VCM), and a digital-to-analog converter (DAC).

Integrated HDC-MPU chip 10, which is configured as, for example, a single semiconductor device, controls the reading and writing of data on the magnetic disk, and other operations. HDC-MPU chip 10 comprises, among other things, a hard disk controller (HDC) 20 that carries out the forming of servo signals and the like, and an MPU macroblock(MPU) 40 that carries out control of the operation of the entire device.

Figure 2:
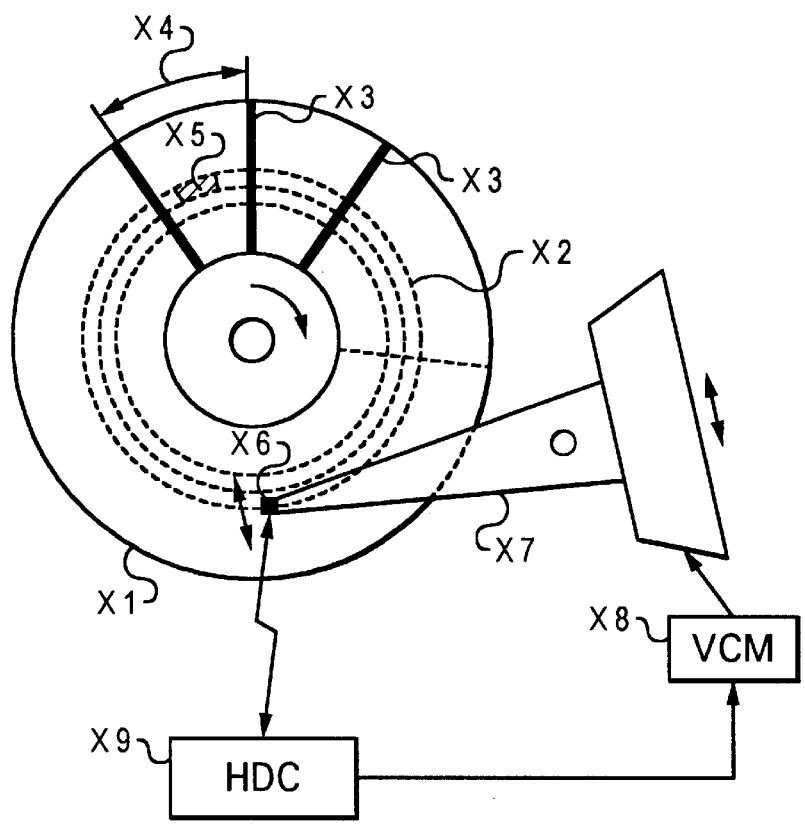
FIG. 2 is an exploded portion of the block diagram of a disk drive device of FIG. 1 in accordance with a preferred embodiment of the present invention.

Referring now to FIG. 2, there is depicted an exploded portion of the block diagram of a disk drive device of FIG. 1 in accordance with a preferred embodiment of the present invention. Tracks X2, with a particular width, are formed concentrically on the recording surface of the magnetic disk 1, as illustrated on magnetic disk X1. Servo areas are provided at regular angular intervals on the recording surface, and servo patterns X3 are recorded in these servo areas. Data sectors X5 are recorded in the areas (data areas) X4 between adjacent servo patterns X3 on each track X2. The recording density may be made more uniform by dividing data areas X4 into several areas (zones) in the radial direction, and recording a number of data sectors X5 responsive to the radial position in each zone.

Figure 3:
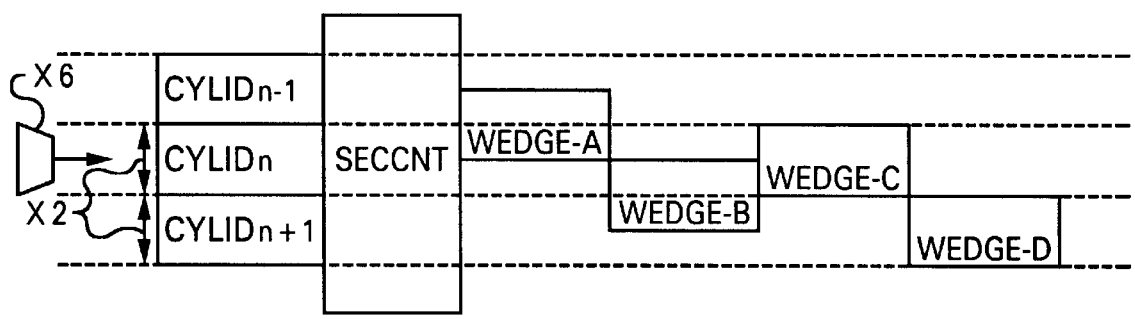
FIG. 3 is a block diagram of an example of a servo sector format employed in the disk drive device of FIG. 2.

With reference now to FIG. 3, there is. illustrated a block diagram of an example of a servo sector format employed in the disk drive device of FIG. 2. As depicted in FIG. 3, a cylinder ID (CYLID) indicating a track number, a physical sector number (SECCNT) indicating the number of the servo pattern, burst patterns (WEDGE-A, WEDGE-B, WEDGE-C, WEDGE-D) for tracking (following) control, and the like are recorded in each servo sector X3. In particular, each servo sector X3 is coded in a coding system suitable for the recording and reproducing thereof. CYLID is recorded in a special notation referred to as a Gray code (cyclic binary code). Differing from ordinary binary notation, this notation is defined so that, each time the value increases by one, only one location in the bit pattern changes. With this notation, even if the head jumps between cylinders n and n−1, the value of one cylinder or the other may be obtained. SECCNT is a number for distinguishing individual servo patterns; this number does not change with changing position in the radial direction, so it is recorded in binary form. Channel 5 reproduces CYLID and SECCNT by decoding them according to their coding, and supplies CYLID and SECCNT to MPU 40.

Burst patterns (WEDGE-A, WEDGE-B, WEDGE-C, WEDGE-D) are magnetic patterns for removing the above-described uncertainty of CYLID, making definite which of the adjacent tracks the head is positioned over, and detecting detailed position on the track. The burst patterns are recorded so that the recording position in the radial direction of the burst patterns, each of which has a width of one track pitch, differs by half of a track pitch at a time, in a cycle of two tracks. Channel 5 supplies integrated HDC-MPU chip 10 with analog voltages A, B, C, D, or with digital values equivalent thereto, corresponding to the reproduced levels of these burst patterns (WEDGE-A, WEDGE-B, WEDGE-C, WEDGE-D).

Referring back in particular to FIG. 1, MPU 40 is a microprocessor that executes a control program. In particular, MPU 40 has a memory or the like for storing the control program and data. By executing the control program, MPU 40 executes input/output control of commands and data with an external device, read/write control for magnetic disk 1, and so on.

HDC 20 of FIG. 1 comprises multiple functional units including a servo control unit (SV) 21, a serial I/O (SIO) 22, a hardware sequencer (SA) 23, a buffer (SG) 24, an SRAM 25, a bus 26 and a bus arbiter 27.

Servo control unit (SV) 21 generates control signals for channel 5, searches for servo patterns, generates CYLIDs from reproduced Gray code output, and so on. In particular, SV 21 comprises an analog-to-digital converter (ADC) that performs AD conversion and ADC registers (ADCREG) that store AD conversion results and the like. Further, in particular, SV 21 generates a control signal CTRL for channel 5, based on a status (STATUS) and a read/write clock (RDWTCLK) from channel 5.

SIO 22, depicted in HDC 20, in general carries out conversion between parallel data and serial data. In particular, SIO 22 converts the servo output (DACOUT, parallel) from SA 23 to serial data for supply to the digital-to-analog converter (DAC) in VCM driving unit 6.

As the frequency of servo output and of input/output of data to channel 5 is low, SIO 22 may be configured in common with the SIO of MPU 40. To combine SIO 22, it is necessary to carry out contention control of the processing of data between MPU 40 and channel 5, and the processing of data supplied from SA 23 and MPU 40 to the DAC in VCM driving unit 6.

SA 23, illustrated in HDC 20, performs calculations of servo data according to, among other things, the reproduced levels A, B, C, D of the servo patterns, which are stored in ADC registers of SV 21. In addition SA 23 has a digital filter structure for supporting differing hardware with a single circuit.

SG 24, depicted in HDC 20, stores a sector buffer segment. SRAM 25 has a capacity of 512 bytes (16 bits×256 words) that is utilized for storage of various types of coefficients, or as a work area for calculations, as well as for passing data. Bus arbiter 27 carries out arbitration to grant the right to use the bus when MPU 40, SA 23, and SG 24, which are interconnected by bus 26, simultaneously request the use of the bus.

As previously described, SA 23 is hardware logic that assists in head positioning control of the disk device. In particular, SA 23 has a digital filter structure embedded in hardware logic for supporting differing hardware, from ultra-miniature HDDs of the one-inch size to large-scale HDDs, with a single circuit.

While MPU 40 operates according to a program, SA 23 operates according to a preset hardware sequence. SA 23 can therefore operate faster than MPU 40, although SA 23 is specialized for calculations for servo control. SA 23 can also operate independently after certain parameters have been set by MPU 40 or another unit, with negligible impact on the processing load of MPU 40 or other unit.

SA 23 is also implemented as part of HDC 20, which is provided in the same device as MPU 40, as described above. The number of terminals for performing external input and output of signals can therefore be reduced while maintaining the same number of interconnections between SA 23 and MPU 40, servo control unit (SV) 21, etc. This implementation can contribute to reductions in package size and device size.

Figure 4:
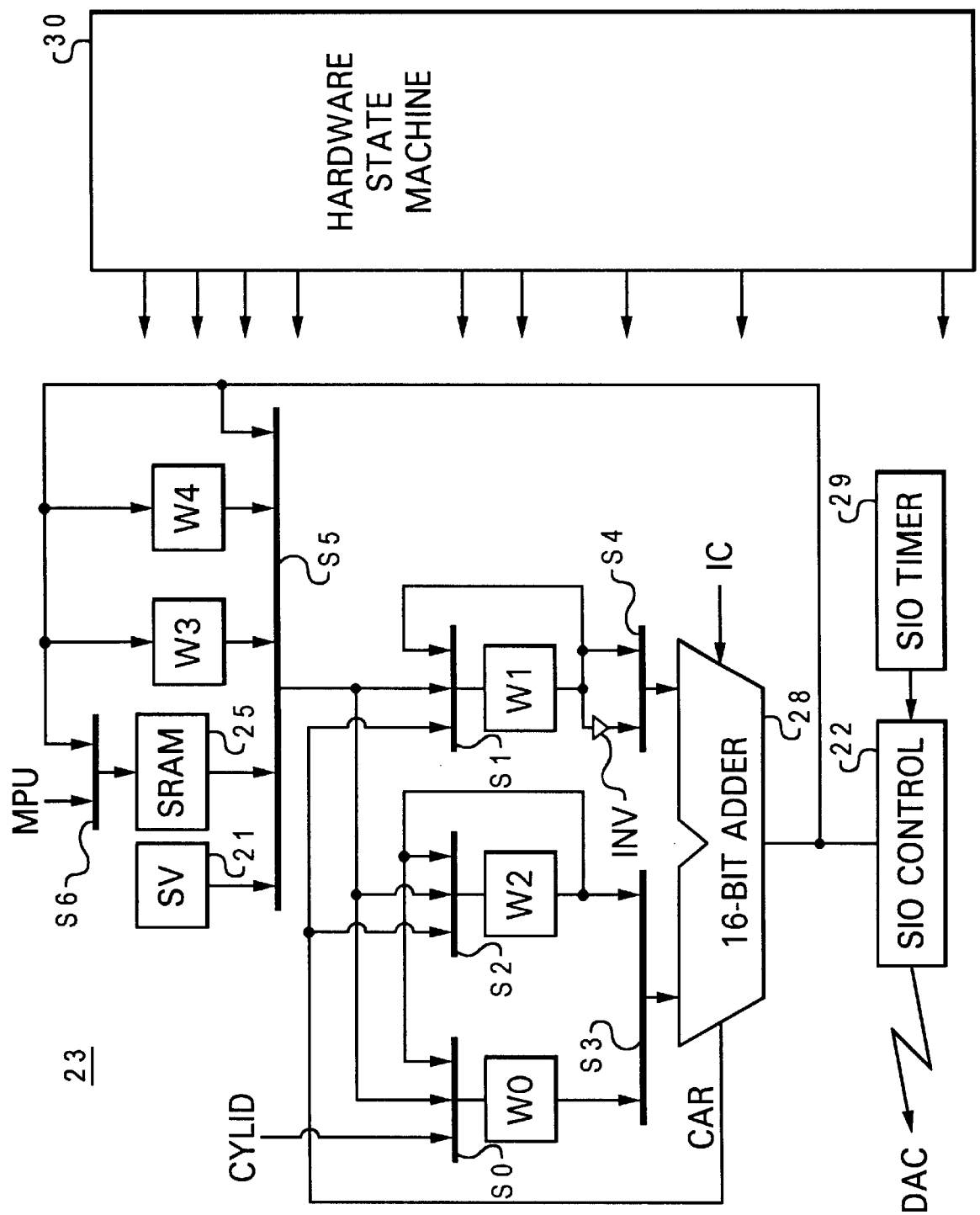
FIG. 4 is a block diagram of a hardware sequencer (SA) in a disk drive device according to an embodiment of the present invention.

Referring now to FIG. 4, there is illustrated a block diagram of a hardware sequencer (SA) in a disk drive device according to an embodiment of the present invention. SA 23 comprises registers W0 to W4 for temporarily storing data, selectors S0 to S6 for selecting the data and performing simple data manipulations such as inverting and shifting, a 16-bit adder (referred to below simply as an adder) 28 that carries out addition of two 16-bit data values, an SIO timer 29 for controlling the output timing of SIO 22, and a hardware state machine (SM) 30 that carries out control of the entire SA 23.

The setting of data in registers W0 to W4 and the control of switching by selectors S0 to S5 are preferably carried out by SM 30, following a predetermined procedure.

Adder 28 is preferably an ordinary binary adder having an initial carry input (IC) and a carry output (CAR). Adder 28 may performs a single addition, such as W0=W0+W1, for example, in 50 ns.

Selector S5 is supplied with the outputs of the ADC registers of SV 21 and SRAM 25, of registers W3 and W4, and of adder 28. The output of selector S5 is supplied to selectors S0, S1, and S2. The output of adder 28 is also supplied to selector S6 and registers W3 and W4. Under control from SM 30, selector S6 selects, and supplies to SRAM 25, data from MPU and output of adder 28. Selector S0 is supplied with the output of selector S5, CYLID, and the output of register W2. The output of selector S0 is supplied to register W0.

Selector S1 is supplied with the output of selector S5, the carry output CAR of adder 28, and the output of register W1. The output of selector S1 is supplied to register W1. Selector S2 is supplied with the output of selector S5, the carry output CAR of adder 28, and the output of register W2. The output of this selector S2 is O supplied to register W2.

The outputs of registers W0 and W2 are supplied to selector S3. Under control from SM 30, selector S3 selects one of the outputs of registers W0 and W2 and supplies the selected output to one input of adder 28. Furthermore, the output of register W1 is supplied to selector S1, an inverter INV, and selector S4. Selector S4 is also supplied with the output of inverter INV. In particular, selector S4 selects either the output of register W1 or the output of the inverter INV, which inverts this output, and supplies the selected output to the other input of adder 28. The output of adder 28 is supplied to SIO 22, and is supplied in serial form to DAC at timings indicated from SIO timer 29.

As depicted, SA 23 is a simple entity comprising an adder 28, several registers W0 to W4, and selectors S0 to S6, but SA 23 is capable of executing calculations for servo control, including filter processing and other complex calculations, the calculations being controlled by SM 30 according to instructions from MPU 40.

Figure 5:
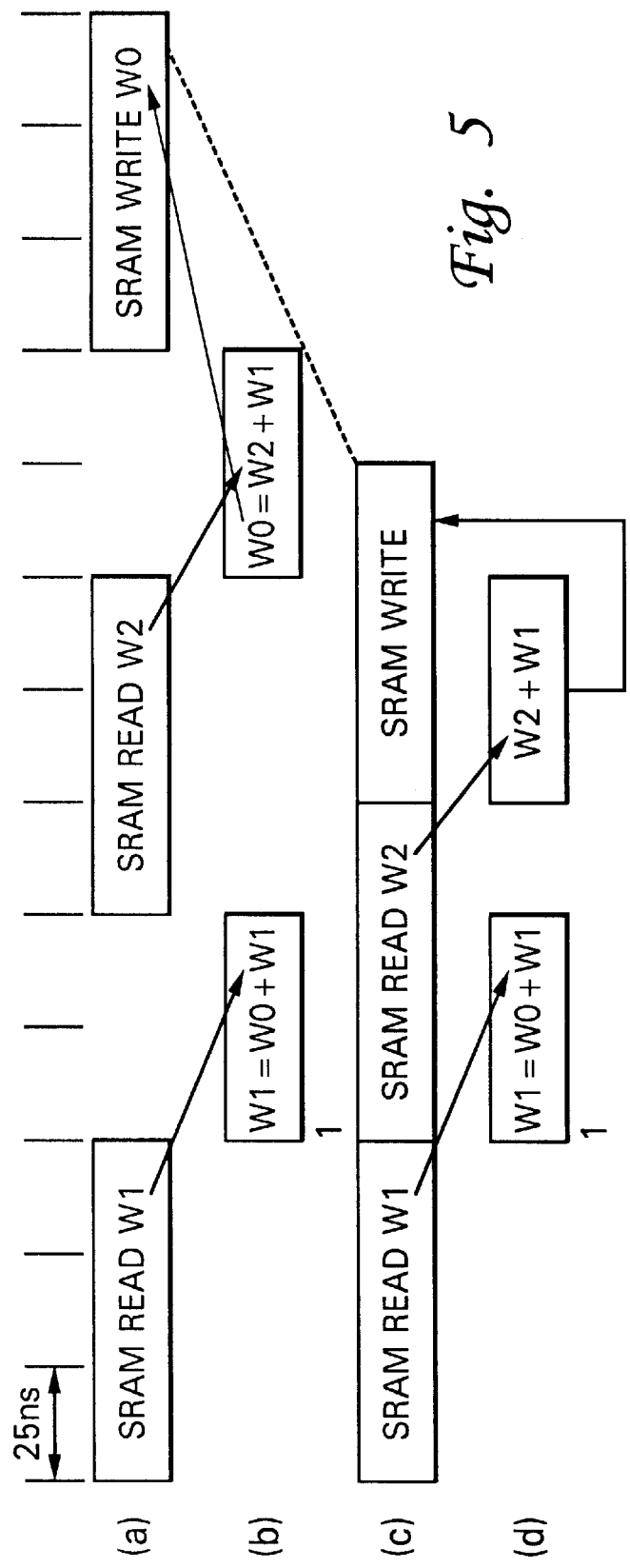
FIG. 5 is a block diagram showing an example of calculation processing by the SA of FIG. 4.

With reference now to FIG. 5, there is depicted a block diagram showing an example of calculation processing by the SA of FIG. 4. SA 23 may perform the calculation operation of addition, as will be described below. To set contents of SRAM 25 in register W1, SM 30 supplies SRAM 25 with the address on SRAM 25 at which the data to be set in register W1 is stored, and a read request. At the same time, SM 30 commands selector S5 to select SRAM 25 and selector S1 to select selector S5. When SM 30 commands data to be set in register Wi in this state, the data read from SRAM 25 is supplied to and set in register Wi as depicted by reference line (a).

When an addition calculation such as W1=W1+W0, for example, is carried out, SM 30 first controls selectors S3 and S4 to set the values of W0 and W1, then commands adder 28 to operate. The value of W0+W1 is thereby output from adder 28. Finally, if control is performed, by controlling selectors S1 and S5, to have the output of the adder supplied to register W1 and register W1 is commanded to store the supplied data, the result of the W0+W1 calculation is stored in W1, as illustrated by reference line (b).

To write the contents of register W0 into SRAM 25, SM 30 has selector S3 select register W0, and zeroes the output of selector S4 and the initial carry IC of adder 28. The value of register W0 thus appears at the output of adder 28. SM 30 simultaneously supplies SRAM 25 with the address on SRAM 25 at which the data of register W0 is to be stored, and a write request. The data held in register W0 is thereby stored at the selected address on SRAM 25, as depicted by reference line (a).

Subtraction, multiplication, and division, or calculations, filter processing, and the like for servo control can also be carried out in the manner described above, in which SM 30 controls the operations of each part according to instructions from MPU 40.

SRAM 25 may also be accessed from MPU 40, so a contention control mechanism is provided to deal with concurrent access. For this reason, one access to SRAM 25, together with contention control, normally requires a time interval of about 75 ns, as illustrated at reference line (a).

Adder 28 is idle during the reading of SRAM 25. Access to SRAM 25 and calculation by adder 28 can therefore be carried out simultaneously if the device is configured so that, after a read from SRAM 25 depicted at reference line (a) has ended, SM 30 commands adder 28 to calculate as illustrated at reference line (b), and simultaneously controls the reading of register data from SRAM 25.

Parallelization of access to SRAM 25 and calculation by adder 28 is also possible by the performance of similar control during writing, but even higher-speed operation is possible if the device is configured so that, as depicted at reference lines (c) and (d). At reference lines (c) and (d), the selection of the address on SRAM 25 at which the calculation result is written and the calculation of W2+W1 are executed concurrently, and after the calculation ends, the sum is written directly to the selected SRAM address.

Configured as described above, SA 23 outputs the servo output (DACOUT) to SIO 22. Or if the hardware processing by SA 23 (referred to below as SA processing) could not be accomplished, SA 23 generates an interrupt signal (SA_INT) and outputs SA_INT to MPU 40.

Figure 6:
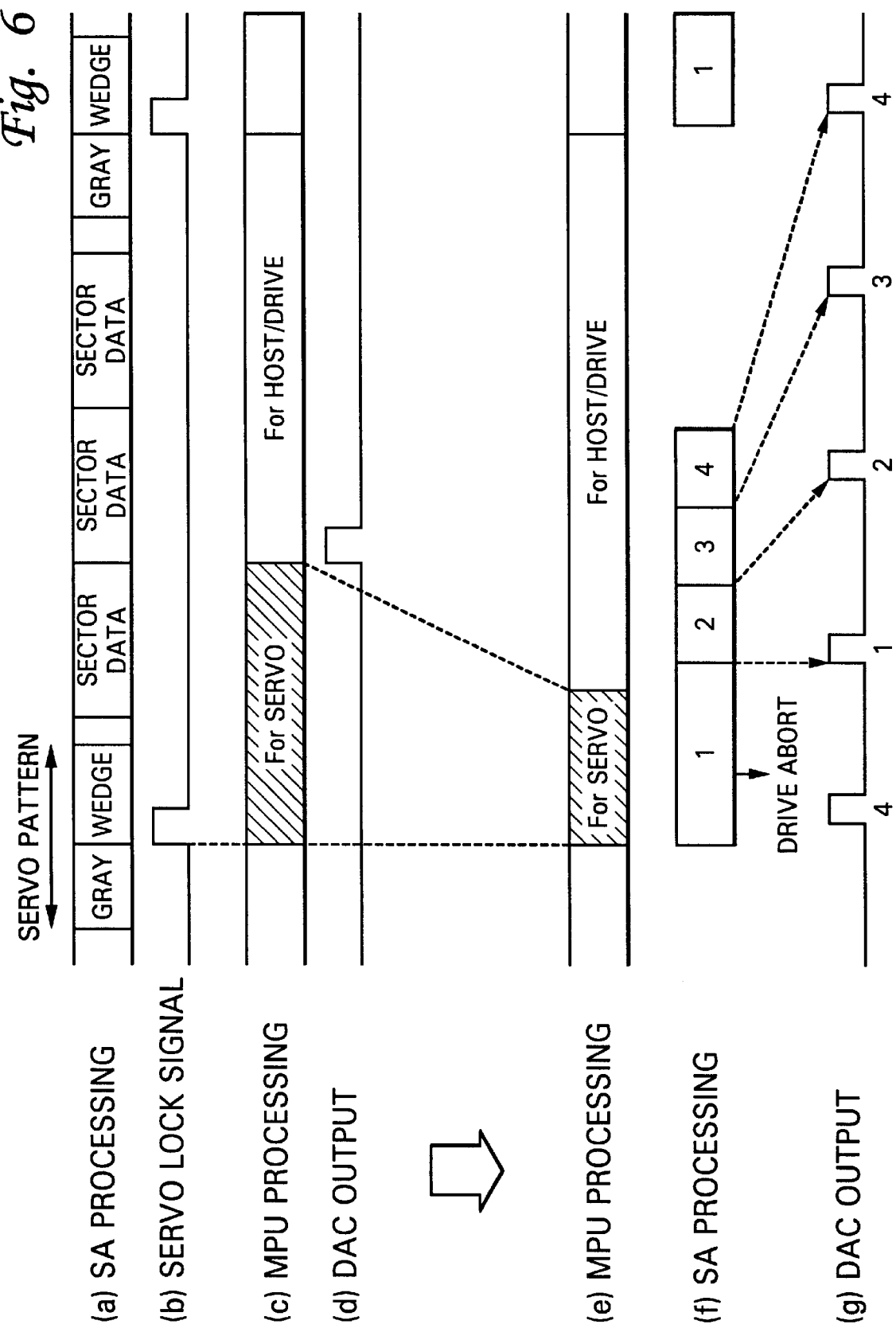
FIG. 6 is a timing diagram for explaining the SA processing of FIG. 5.

Referring now to FIG. 6, there is illustrated a timing diagram for explaining the SA processing of FIG. 5. In general, a reference line(a) depicts the servo pattern. Reference lines (b), (c) and (d) show the servo lock signal (generated after the channel 5 detects the servo pattern), MPU processing, and DAC output when SA processing is not carried out (when there is no SA). Reference lines (e), (f) and (g) show the MPU processing, SA processing, and DAC output when SA processing is carried out.

Besides performing oversampling processing by employing target functions, described below, SA 23 in the present embodiment has a newly provided digital filter function.
Target Functions The target functions of SA 23 are utilized to reduce the processing load of the MPU in servo processing, and to assist in head positioning control in a disk device. As depicted at reference line (f), SA processing is started by an interrupt signal supplied from SV 21. SA 23 executes a servo feedback-value calculation, inhibits (aborts) read/write processing, and creates control data (DACOUT) once per servo pattern.

In FIG. 6, positional error information PES is determined on the basis of the extracted CYLID received from channel 5, notifications of the end of four AD conversions received from SV 21, and the conversion result-data (8 bits to 10 bits) from the ADC registers. Normally, control data DACOUT is supplied to VCM driving unit 6 once each time a servo pattern is reproduced. The servo pattern cycle is about 5 kHz to 10 kHz; if left unchanged, the sound produced by vibration of head arm 3 is within the humanly audible frequency band, and is perceived as noise.

The sound produced by vibration of head arm 3 can be moved outside the humanly audible frequency band by performing oversampling processing to output the control data (DACOUT) in multiple installments (here, four installments) per servo pattern.

In this case, SA 23 executes the processing up to the calculation of the above-mentioned servo data CNTIN only once per servo pattern, executes filter processing, and outputs the first DACOUT. Immediately afterward, SA 23 performs the filter processing for the second DACOUT, then waits until there is a DACOUT request from the timer that measures the DACOUT interval. When there is a DACOUT request from the timer, the already-calculated DACOUT is output. Similar processing is repeated a prescribed number of times. DACOUT can be output at intervals equal to one-fourth the servo pattern interval in this way.

If output of the control data DACOUT is carried out four times within the servo pattern reproduction interval in this way (that is, with 4×oversampling), the processing done the first time, which is the most time-consuming, must end in one-fourth the servo pattern reproduction interval (in about 25 μs if the rotational speed of the media is 7200 rpm with eighty servo patterns per revolution, so that a servo pattern is reproduced approximately every 104 μs).

Noise in the audible band can be reduced by carrying out this type of oversampling processing even if the above-mentioned LPF filter is not employed during seeking. The processing load for filtering can accordingly be reduced. An even greater reduction in noise in the audible band can be realized by carrying out this type of oversampling processing together with the above-mentioned LPF filter.

Digital Filter Function

The digital filter function of SA 23 is a function that creates a multi-purpose digital filter in one circuit by varying the DACOUT values and multiple DACOUT processes. Because SA 23 operates according to a preset hardware sequence, it can operate at high speed, and can be made to operate independently of MPU 40, etc.

The configuration of a disk drive device according to the present embodiment has been described above, but as noted above, the characteristic part of the present embodiment is the structure of the digital filter that SA 23 implements by hardware logic.

It lies, that is, in the possession of a digital filter structure, embedded in hardware logic, for supporting differing hardware, from microdrives to high-end HDDs, with a single circuit. In other words, SA 23 in the present embodiment is not merely hardware logic that assists in head positioning control of the disk device. If SA 23 has the digital filter structure described below, it can be applied to any type of disk drive device or any actuator positioning control method.

With reference now to FIG. 7, there is illustrated a block diagram of the mode select registers of the SA of FIG. 4. In FIG. 7, Fn_MODE is the mode select register structure of SA 23, which has seven registers from F0_MODE to F6_MODE at even addresses from, for example, 0570 (hexadecimal, likewise hereunder) to 057C.

As the seven mode select registers Fn_MODE, SA 23 possesses multiple (seven) filters, each of which can be defined as a peak filter or a notch filter. The present embodiment provides seven mode select registers Fn_MODE that are definable as peak or notch filters, however in alternate embodiments, other multiples of filters may be utilized.

Referring now to FIG. 8, there is depicted a chart of the bit structure of the mode select registers of the SA of FIG. 4, showing the structure of seven mode select registers in the present embodiment. As depicted in FIG. 8, the mode select registers Fn_MODE have a sequential structure, being disposed in sequence from F0_MODE to F6_MODE. These registers Fn_MODE are employed sequentially, the relevant bits being set for just the necessary number of filters, starting from F0_MODE. Accordingly, in the stages following the filter configured by the definitions made in mode select register F1_MODE, for example, the filters configured by definitions made by registers F2_MODE to F6_MODE are deployed; the filter already defined by F0_MODE is not redeployed.

The seven mode select registers Fn_MODE are 16-bit registers. The filter type, the filter inputs and outputs, and so on of registers Fn_MODE are defined by the settings of their individual bits. The first bit selects the filter type, selecting a serial type of filter that is deployed serially with respect to the control calculation (DACOUT) output, or a parallel type of filter that is deployed in parallel. In the present embodiment, a peak filter of frequency, giving a peak in o the output gain, is employed as the parallel type of filter, and a notch filter for mechanical resonance suppression is employed as the serial type of filter.

The filters defined by the seven mode select registers Fn MODE constitute peak filters when the first bit is '0', and notch filters when the first bit is '1'. Thus, one of two filters, a peak filter or a notch filter, is defined by the first bit.

The first bit of the register F0_MODE, the first of the seven mode select registers Fn_MODE, however, is always set to '0' to configure one peak filter. Also, the first bit of one of the remaining registers F1_mode to F6_MODE is always set to '1' to configure at least one notch filter.

Figure 9:
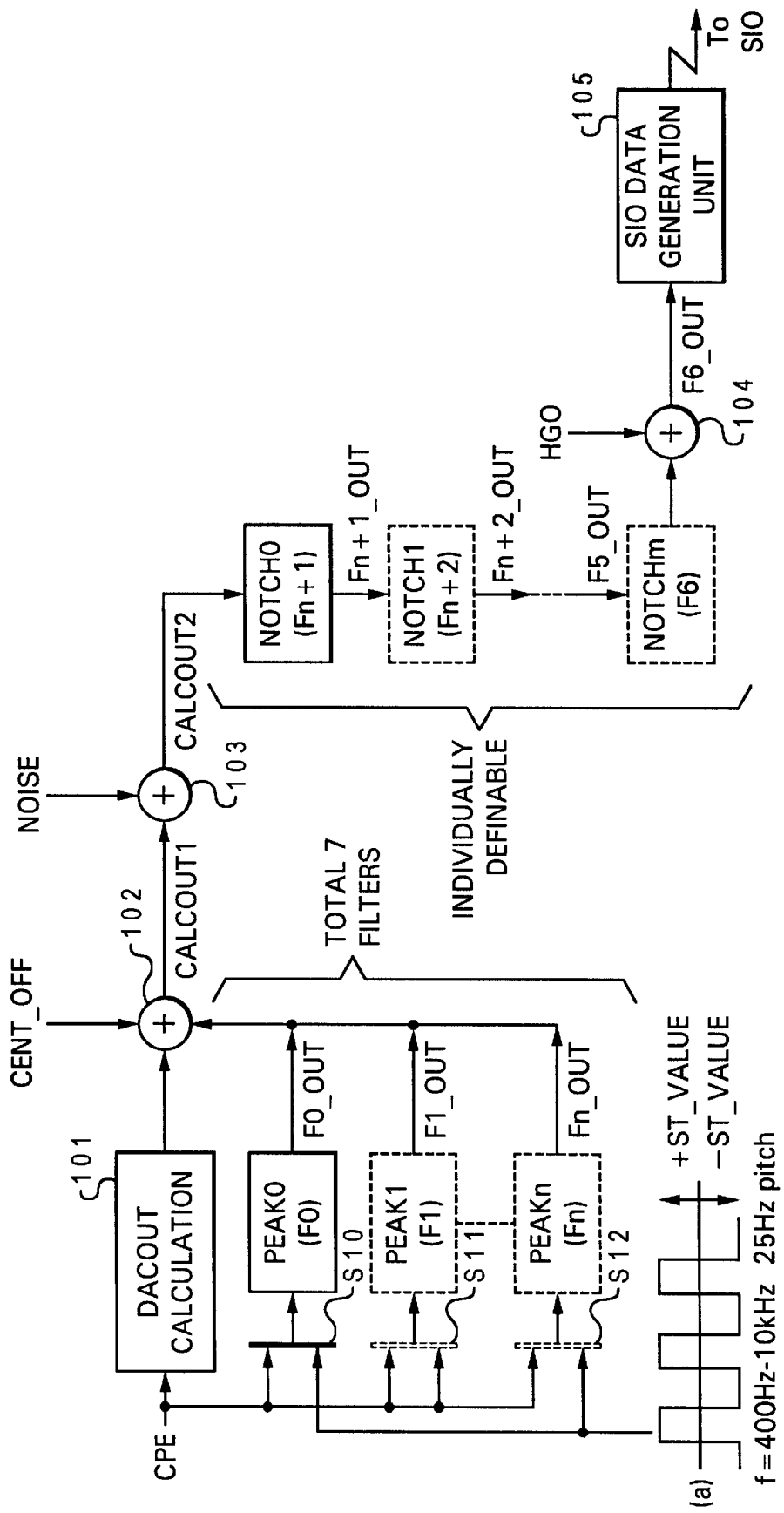
FIG. 9 is a block diagram of a data flow of a digital filter implemented by the hardware logic of the SA of FIG. 4.

With reference now to FIG. 9, there is depicted a block diagram of a data flow of a digital filter implemented by the hardware logic of the SA of FIG. 4. In particular, the diagram may be applied to a digital filter controlling the head arm actuator in a disk device.

The filter type, filter inputs and outputs, and the like can be defined freely by settings of the bits of the seven mode select registers Fn_MODE, as described above. FIG. 9 accordingly depicts an example of the configuration of a digital filter implemented on hardware logic by settings of the Fn_MODE registers.

The deviation (CPE) between the positional error information (Position Error Signal) PES calculated on the basis of the current track and the sought target track is input to the digital filter of FIG. 9.

The digital filter comprises a DACOUT calculation unit 101 that carries out calculations for servo control to make the output DACOUT constant with respect to this deviation (CPE). Selectors S10 to S12 of the digital filter select CPE and a square-wave pulse ±ST_VALUE. Multiple(F0 to Fn) of peak filters PEAK0 to PEAKn, placed in parallel with the DACOUT calculation unit 11, output filter outputs F0_OUT to Fn_OUT within the digital filter. An adder 102 adds a center offset CENT_OFF and outputs the resulting sum CALCOUT1. In particular, the center offset CENT_OFF is an offset value that is added to DACOUT from an external source when necessary.

With reference still to FIG. 9, an adder 103 is depicted that adds noise NOISE and outputs the resulting sum CAL-COUT2. The noise NOISE is noise that microcode inputs from an external source when necessary. This noise is utilized to retain the conventionally practiced method of noise injection by microcode, even though a feature of the present embodiment is that it can measure the frequency characteristics of the actuator by injecting noise comprising the square-wave pulse ±ST_VALUE.

Moreover, the digital filter comprises notch filters NOTCH0 to NOTCHm placed in multiple stages (Fn+1 to F6) in series with the output of DACOUT calculation unit 101. An adder 104 adds an offset HGO to the output F5_OUT of the last-stage notch filter NOTCHm and outputs the resulting sum F6_OUT. The offset HGO is an offset employed when the output gain is switched. Finally, an SIO data generation unit 105 generates serially formatted SIO data from F6_OUT and outputs it to SIO 22.

FIG. 9 includes a square-wave pulse ±ST_VALUE supplied to selectors S10 to S12. In particular, to produce the square wave pulse, a source oscillation circuit with the reference frequency (50 MHz) of the logic itself, a frequency divider that divides the source oscillations of this source oscillation circuit down to an arbitrary period, and a frequency division register, in which the division factor of the frequency divider is set, are provided in integrated HDC-MPU chip 10 (though none of these are depicted in the drawings).

When a register value (hexadecimal) is set in the frequency division register, a toggle frequency (for example 400 Hz) is output. A detailed description will be given latter, utilizing FIG. 14 and FIG. 16. As depicted in FIG. 9(a), the square-wave pulse ±ST_VALUE generated from this toggle frequency is injected through selectors S10 to S12 into peak filters PEAK0 to PEAKn. Noise equivalent to a sine wave can be generated by making the peak frequency of the peak filters PEAK0 to PEAKn match the above-mentioned toggle frequency of 400 Hz.

Referring still to FIG. 9, selectors S10 to S12 may select the square-wave pulse ±ST_VALUE, which is noise for measurement, and inject this noise into the peak filters PEAK0 to PEAK. Because mechanical resonance of the actuator is present, it is fed back and monitored. The input waveform is compared with the returning waveform. The input waveform is greatly altered if the input waveform matches the resonant frequency of the noise for measurement, so the mechanical resonant frequencies can be identified by measuring this condition. In particular, mechanical resonant frequencies can be identified in real time in the drive itself, without utilizing a microprocessor, tester, or the like, so it is possible to set notch filter parameters such that there is no gain at those mechanical resonant frequencies.

Regarding the filters configured in the multiple stages, in most cases one is utilized as a peak filter and two or three as notch filters, although it depends on the relevant disk drive device and servo control timing. While the present invention is adapted to configure at least one peak filter and at least one notch filter on hardware, it is not absolutely necessary to use this type of configuration scheme. There can be cases that do not employ either a peak filter or a notch filter. Output is disabled in these cases by the enable bits of the outputs Fn_OUT of the peak filters.

As explained above, a multi-purpose programmable digital filter can be configured with multiple stages by bit settings of the seven mode select registers Fn_MODE of SA 23, and the coefficients of the filters can be self-tuned in real time. The selection of the peak and notch filters configured according to the Fn_MODE bit settings, details of peak filter settings and operation, the method of generating square-wave pulses for measurement, details of notch filter settings and operation, details of the DACOUT calculation, and a specific example of a digital filter configuration will be described.

Selection of Peak and Notch Filters

As depicted in FIG. 7, SA 23 has seven mode select registers F0_MODE to F6_MODE disposed sequentially at even addresses from address 0570 to address 057C. These Fn_MODE registers are 16-bit registers. If '0' is set in the first bit, the filter defined by Fn_MODE constitutes a peak filter. If '1' is set in the first bit, the filter defined by Fn_MODE constitutes a notch filter.

A peak filter is always configured, by setting '0' in the first bit of the first Fn_MODE register F0_MODE, and at least one notch filter is configured, by setting '1' in the first bit of one of the remaining registers F0_MODE to F6_MODE.

One peak filter has already been configured by setting '0' in the first bit of the first register F0_MODE as described above, but if it is desired to deploy another peak filter in parallel, '0' is set in the first bit of the next register F1_MODE. A '0' is similarly set in the first bits of the registers for the necessary number of peak filters.

To configure a notch filter, a '1' is set in the first bit of the next register after the settings of the peak filters have been finished. A notch filter is thereby configured in series on the output side of DACOUT. A '1' is similarly set in the first bit of the registers for the necessary number of notch filters.

In this way, when utilizing the seven sequentially disposed mode select registers F0_MODE to F6_MODE, first the necessary number of peak filters are configured, then notch filters are configured using the next registers after the register that ended the peak filter settings. After a notch filter has been configured by setting '1' in the first bit, a peak filter cannot be configured again by setting '0' in the first bits of the following registers.

The first bits of the seven mode select registers Fn_MODE are scanned in sequence from F0_MODE to F6_MODE in this state. When a notch filter that has been set is encountered in this scan, all of the following filters become notch filters. Further, each filter has an enable bit whereby any mode in the range from 0 PEAK+6 NOTCH to 6 PEAK+0 NOTCH can be selected.

The structure of a filter configured with multiple stages can accordingly be determined by making just one scan of the first bits of the seven sequentially disposed mode select registers Fn_MODE. For example, if the first bit of F0_MODE is set to '0' and the first bit of F1_MODE is set to '1,' one peak filter PEAK0 paralleling the DACOUT calculation unit 101, and one notch filter NOTCH0 in series with the output thereof, will be configured on the hardware logic of SA 23 illustrated in FIG. 9. In particular, the present example is indicated in FIG. 9 by the blocks depicted with solid lines. This configuration, with one peak filter and one notch filter, is the minimum configuration. At the maximum, seven parallel or serial filters can be thus configured by settings of the first bits of the Fn_MODE registers.

The filter structure is determined in the above manner, but the configured filter outputs are not always all utilized. The configured filter outputs can also be output in specific output patterns (for example, for each servo, or during measurement) by settings of the output enable bits in the registers. For example, if noise for measurement is input to peak filter PEAK0 in the digital filter configuration of FIG. 9 and DACOUT is monitored, the frequency characteristics of the actuator can be measured by a bandpass-filter-like effect. In this monitoring, the actuator operates with respect to the filter actually configured, the presence or absence of disturbances and mechanical resonant frequencies is measured, and a filter suppressing these disturbances is inserted. The configuration of the filters here shall be the minimum necessary filters such that disturbances and mechanical resonant frequencies do not occur (because when the filter processing is computed, a corresponding delay arises, to the detriment of servo control). The enable bits of the filter outputs are employed in servo control, as well as at test times such as this.

The processing of the configured filters is executed by SA 23 in FIG. 1. Switching of the filter characteristics as above can therefore be carried out by altering the coefficients of the calculations done by SA 23.

Figure 10:
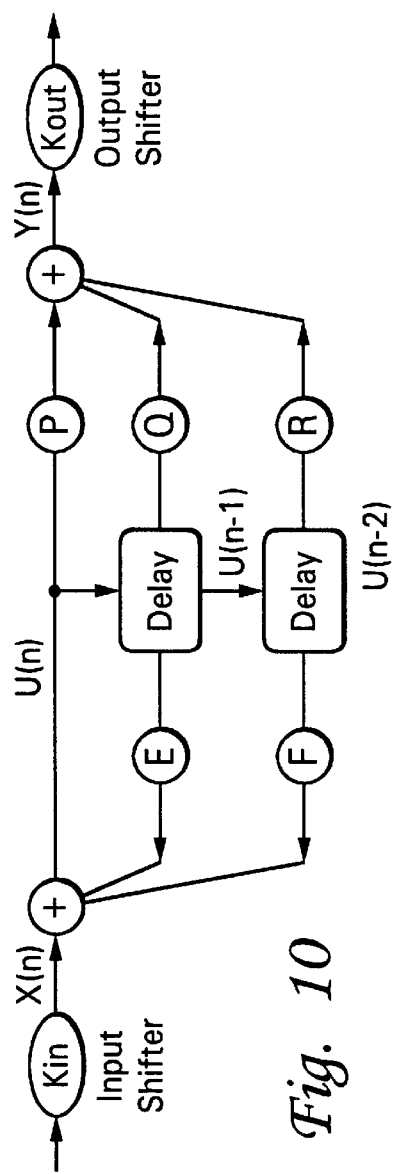
FIG. 10 is a conceptual block diagram of a peak filter, conceptually expressing the computational structure of the filter processing by the SA of FIG. 4, when deployed in parallel.

Referring now to FIG. 10, there is depicted a conceptual block diagram of a peak filter, conceptually expressing the computational structure of the filter processing by the SA of FIG. 4, when deployed in parallel. In addition, with reference to FIG. 11, there is illustrated a conceptual block diagram of a notch filter, conceptually expressing the computational structure of the filter processing by the SA of FIG. 4, when deployed in series.

Figure 11:
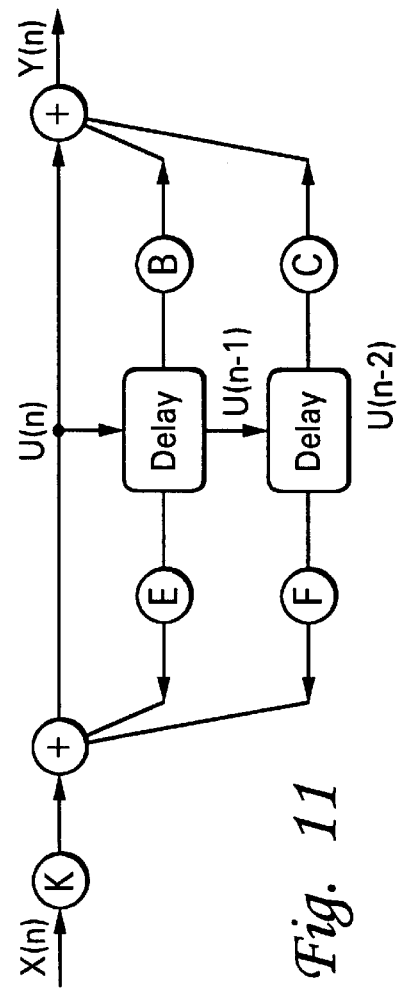
FIG. 11 is a conceptual block diagram of a notch filter, conceptually expressing the computational structure of the filter processing by the SA of FIG. 4, when deployed in series.

In FIGS. 10 and 11, the basic form of the filter is a second-order IIR digital filter, having delays U(n−1) and U(n−2) and filter coefficients. A second-order IIR digital filter having this basic form is utilized as a peak filter or a notch filter according to the above-mentioned settings.

For example, the peak filter depicted in FIG. 10 includes an input shifter Kin, unit time delays U(n−1) and U(n−2) (the unit time being, for example, the interval at which servo sectors are reproduced), filter coefficients E, F, P, Q, R, and an output shifter Kout.

When the form of this peak filter is selected, hardware logic configures the peak filter by taking filter coefficients, delayed values, and filter output results stored at addresses from 0580 to 058E in the registers depicted in FIG. 12, described below.

The notch filter depicted in FIG. 11 has unit time delays U(N−1) and U(n−2) and filter coefficients K, E, F, B. When the form of this notch filter is selected, the notch filter is configured by taking the filter coefficients, delayed values, and filter output results stored at addresses 0590 to 059E in the registers depicted in FIG. 17, described below. The same registers can be utilized for the registers depicted in FIG. 12 and FIG. 17. However, the present embodiment stores coefficients and the like in identical sequences in consecutive blocks of addresses. Moreover, reading and writing of these coefficients from MPU 40 is possible, for example, through SRAM 25, registers W0 to W4, and the like depicted in FIG. 4 above.

Peak Filter Settings and Operation

As explained above, a peak filter is always configured by setting '0' in the first bit of at least the first register F0_MODE among the Fn_MODE registers. To place other peak filters in parallel, '0' is set in the first bit of the next register FL_MODE, and the necessary number of peak filter stages thereafter are also configured.

Figure 12:
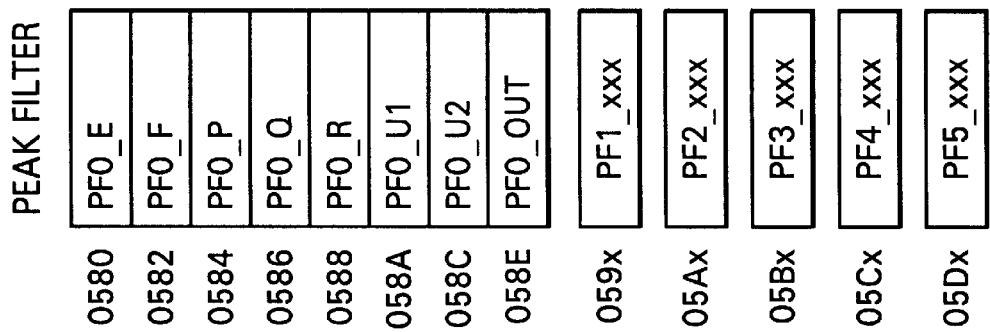
FIG. 12 is a block diagram of the registers utilized by a peak filter.

Referring now to FIG. 12, there is depicted a block diagram of the registers utilized by a peak-filter. In particular, these are the registers utilized in the configuration and calculations of a peak filter. The coefficients, delayed values, and output value of the first peak filter are stored at addresses 0580 to 058E. Processing values of the other peak filters are stored at addresses 059x to 05Dx.

With reference now to FIG. 13, there is illustrated a block diagram of the registers utilized in the input/output processing of a peak filter. A filter calculation value CALCOUT1 obtained by adding the filter output to DACOUT is stored at address 055E, the input data CPE is stored at address 0560, the square-wave pulse for measurement ST_VALUE is stored at address 057E, and the input timing value of ST_TIME is stored at address 00EE.

Referring now to FIG. 14, there is depicted a chart of the bit structure of the Fn_MODE registers in peak filter processing. The meaningful bits in peak filter processing are the bits indicated by x in FIG. 14:

STSEL, set in the fourth leading bit; ISHCNT, set in bits seven to nine; ENABLE, set in the twelfth bit; and OSHCNT, set in bits fourteen to sixteen.

STSEL is the self-tuning input selection bit. If '0' is set in STSEL, CPE is input to the filter; if '1' is set in STSEL, noise for measurement (ST_VALUE×ST_TGL) is input. A description of "ST_VALUE×ST_TGL" will be provided in FIG. 16. Setting '0' or '1' in STSEL is a function equivalent to switching by selectors S10 to S12 on the digital filter in FIG. 9.

ISHCNT is the right-shift count of the input data, utilized for carrying out a data shift to prevent bit overflow or underflow in the peak-filter processing. This processing is equivalent to the data shift by the input shifter Kin on the peak filter in FIG. 10. ISHCNT is set by three bits. Setting '010' in ISHCNT gives the standard position; no data shift is performed. Setting '000' in ISHCNT shifts the standard position two bits to the left. Setting '111' shifts the standard position five bits to the right.

ENABLE is the output enable bit of the peak filter output PFn_OUT which determines whether or not to add the peak filter output PFn_OUT to the servo calculation control output DACOUT for output as CALCOUT1. This is the function that selects whether or not to output the peak filter output PFn_OUT to adder 102 on the digital filter in FIG. 9. The presence or absence of the output of a peak filter (PEAK) configured in parallel form can be changed as necessary by this ENABLE. For example, it is possible to restrict the output of PEAK to tests only, or to a particular servo output only, or to create a condition without any peak filter.

OSHCNT is the left shift count of the output data, utilized for carrying out a data shift to prevent bit overflow or underflow in the peak filter processing. This OSHCNT returns the data shift set by the above ISHCNT to the original state, a process equivalent to the data shift by the output shifter Kout on the peak filter in FIG. 10. ISHCNT is set by three bits. Setting '010' in OSHCNT gives the standard position; no data shift is performed. Setting '000' in ISHCNT shifts the standard position two bits to the right. Setting '111' in ISHCNT shifts the standard position five bits to the left.

Figures 15, 16:
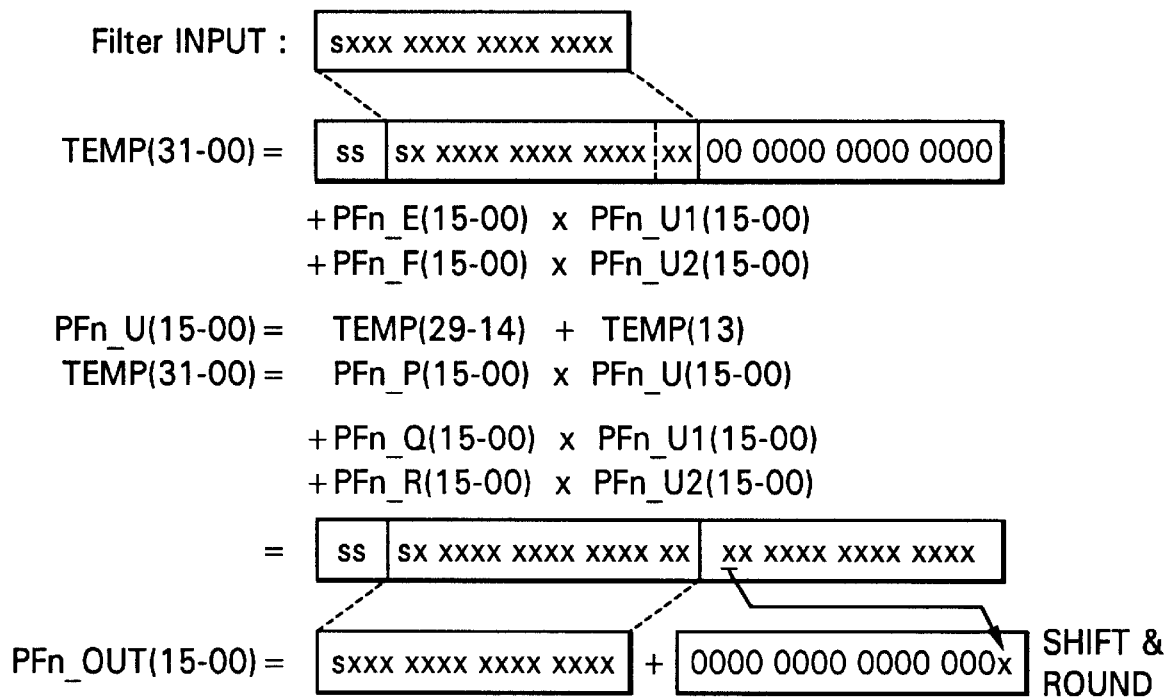
FIG. 15 is a chart of the specific calculations in the peak filter processing by the SA.
FIG. 16 is a chart of toggle frequencies output by settings of ST_TIME.

With reference now to FIG. 15, there is depicted a chart of a specific calculation in the peak filter processing by the SA. This peak filter processing is preferably executed by SA 23 using the registers depicted in FIG. 12 and FIG. 13. The second-order digital filter depicted in FIG. 10 is also implemented by this filter processing.

First, when the input data (16 bits) is input, the input data is right-shifted according to the bits set in the right shift count ISHCNT. If '000' is set in ISHCNT, the position, shifted two bits to the left, becomes the standard position here.

A temporary TEMP(31-00) is determined according to an equation (1) on the basis of the data shifted two bits to the left. TEMP(31-00) defines bits 31 to 00 of TEMP.

TEMP(31-00)=ss sx xxxx xxxx xxxx xx 00 0000 0000 0000

$$+PFn\_E(15\text{-}00) \times PFn\_U1(15\text{-}00)$$

$$+PFn\_F(15\text{-}00) \times PFn\_U2(15\text{-}00) \qquad (1)$$

To give a brief explanation of equation (1), the (32-bit) result of multiplying PFn_E(15-00) by PFn_U1(15-00) and the (32-bit) result of multiplying PFn_F(15-00) by PFn_U2(15-00) are added to the data shifted two bits to the left, and the sum is stored in temporary TEMP(31-00).

Next, PFn_U(15-00) is determined according to an equation (2). As depicted in equation (2), PFn_U(15-00) is a total 16-bit value, TEMP(13) being added to intermediate value TEMP(29-14) in temporary TEMP(31-00).

$$PFn\_U(15\text{-}00)=\text{TEMP}(29\text{-}14)+\text{TEMP}(13) \qquad (2)$$

Next, TEMP(31-00) is determined from these register values according to an equation (3).

TEMP(31-00)=*PFn_P*(15-00)×*PFn_U*(15-00)+*PFn_Q*(15-00)× *PFn_U1*(15-00)+*PFn_R*(15-00)×*PFn_U2*(15-00) =ss sx xxxx xxxx xxxx xx xx xxxx xxxx xxxx (3)

The output value PFn_OUT(15-00) is determined by an equation (4). In particular, the output value PFn_OUT(15-00) of the filter is the sum of the sixteen left-side bits of TEMP(31-00) and the one most significant bit on the right side, shifted right by two bits because '000' is set in OSHCNT.

$$PFn\_OUT(15\text{-}00) = sxxx\ xxxx\ xxxx\ xxxx + 0000\ 0000\ 0000\ 000x \quad (4)$$

After the output value PFn_OUT(15-00) of this filter has been determined in equation (4), the values of internal variables of SA 23 (held in the registers depicted in FIG. 12), that is, the delayed values PFn_U2(15-00) and PFn_U1(15-00), are set according to equation set (5).

$$PFn\_U2(15\text{-}00) = PFn\_U1(15\text{-}00)$$
$$PFn\_U1(15\text{-}00) = PFn\_U(15\text{-}00) \quad (5)$$

The peak filter PEAK depicted in FIG. 9 may be implemented by this type of processing. The presence or absence of the output of the configured peak filter PEAK can be changed freely by the setting of ENABLE in FIG. 14. The process of adding the peak filter output PFn_OUT to DACOUT and outputting it as CALCOUT1 is depicted in n equation (6).

$$CALCOUT1 = CALCOUT1 + PFn\_OUT \ (ENABLE = 1) \quad (6)$$
$$= CALCOUT1 \ (ENABLE = 0)$$

Generating a Square-Wave Pulse for Measurement

As depicted in FIG. 9, a square-wave pulse ±ST_VALUE is supplied as noise for measurement. In particular, noise for measurement (ST_VALUE×ST_TGL) is injected by switching into the peak filters PEAK0 to PEAK. ST_TGL takes on the values +1 and −1 at a toggle frequency defined by ST_TIME.

Referring now to FIG. 16, there is depicted a chart of toggle frequencies output by settings of ST_TIME.

ST_TIME is a register value stored hexadecimally as depicted in FIG. 16. The stored numerical value is output by address specification. ST_TIME and ST_TGL are related as depicted in an equation (7).

$$(017D\ 7840\ h) \quad (7)$$
$$ST\_TIME = \frac{25{,}000{,}000}{\text{toggle frequency}} - 1$$

In particular, FIG. 16 depicts toggle frequencies output by settings of ST_TIME. For example, if F423h is set in ST_TIME, a toggle frequency of 400 Hz is output. Thus the frequency of the square-wave pulse ±ST_VALUE supplied as noise for measurement can be switched easily, just by changing the value set in ST_TIME.

Notch Filter Settings and Operation

A notch filter is configured when '1' is set in the first bit of an Fn_MODE register. In the present embodiment, at least one notch filter is configured by setting '1' in the first bit of one of the registers from F1_MODE to F6_MODE.

Figures 17, 19, 20, 21:
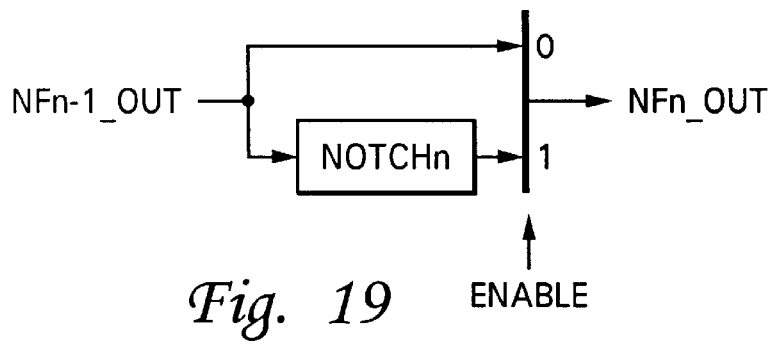
FIG. 17 is a block diagram of the registers utilized by a notch filters.
FIG. 19 is a circuit diagram for implementing processing repeated at each servo.
FIG. 20 is a block diagram of the registers utilized in the DACOUT calculation.
FIG. 21 is a block diagram of the registers utilized in the PE prediction calculation.

With reference to FIG. 17, there is depicted a block diagram of the registers utilized by a notch filter. These are the registers utilized in the configuration and calculation of a notch filter. In particular, the first notch filter coefficients, delayed values, and output value are stored at addresses 0590 to 059E. Further, processing values of the other notch filters are stored at addresses 05Ax to 05AE.

Figures 18, 22:
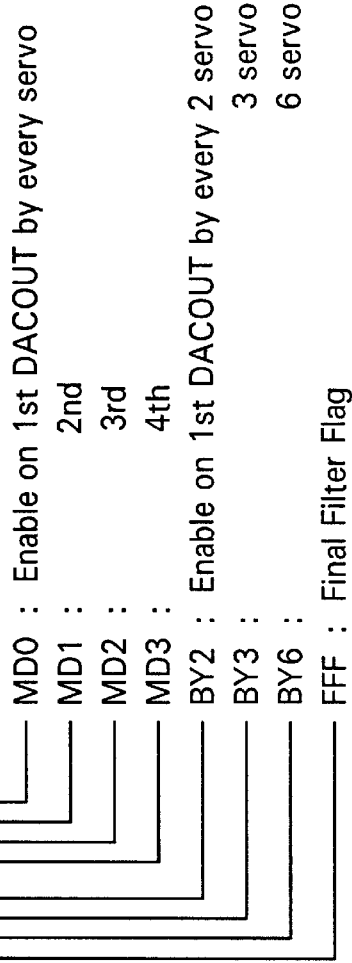
FIG. 18 is a chart of the bit structure of the Fn_MODE registers in notch filter processing.
FIG. 22 is a chart of a bit structure, for describing a specific example of a filter configured with multiple stages, when Fn_MODE registers are defined.

Referring now to FIG. 18, there is illustrated a chart of the bit structure of the Fn_MODE registers in notch filter processing. The meaningful bits in notch filter processing are the bits indicated by x in FIG. 18: MD0 to MD3, set in the lower bits 13 to 16; BY2, BY3, and BY9, set in bits 10 to 12; and FFF, set in the ninth bit.

MD0 through MD3 are output enable bits of the notch filter output NFn+1_OUT. Thereby, the number of outputs per servo (one to four times) is set in four parallel bits. For example, if '1' is set in MD0 (and '0' in MD1 through MD3), there is one output per servo; similarly, if '1' is set in MD3 (and '1' in MD0 through MD2), there are four outputs per servo. The positional relationship between the servo signal and the servo output DACOUT is depicted in FIG. 6, reference lines (f) and (g). Strictly speaking, per servo means each time a servo sector is reproduced and the servo data is calculated, as depicted in FIG. 6, reference line (a).

With reference now to FIG. 19, there is depicted a circuit diagram for implementing processing repeated at each servo. As depicted, if the ENABLE bit is '0,' the filter output of the preceding stage is output without alteration to the following stage at all timings. If the ENABLE bit is '1,' the output passes through filter NOTCHn at one or more timings per servo. The specific timings are set in the above MD0 to MD3.

Referring again to FIG. 18, BY2, BY3, and BY6 are output enable bits of the notch filter outputs PFn+1_OUT. Thereby, the number of servos per output is set in three parallel bits. For example, if '1' is set in BY2 (and '0' in BY3 and BY6), there is one output every two servos. Similarly, if '1' is set in BY3 (and '0' in BY2 and BY6), there is one output every three servos. Further, if '1' is set in BY6 (and '0' in BY2 and BY3), there is one output for every six servos. The positional relationship between the servo signal and the servo output DACOUT is depicted in FIG. 6, reference lines (f) and (g). This function, which provides one output for multiple servos, is employed in situations such as performing filter output only at a particular servo. By the present method, finely detailed servo control is possible. For example, when SA processing is carried out four times per servo and DACOUT is output four times, as depicted in FIG. 6, reference lines (f) and (g), filter output can be performed in the first SA processing, but not performed the second and subsequent times.

Depicted in FIG. 18, FFF is a final filter flag indicating the last filter processed. In particular, when a '1' is set in this flag FFF, no processing is carried out for the subsequent filters. A reduction effect on processing time can thus be obtained.

The notch filter processing previously described is executed by the SA 23, utilizing the registers depicted in FIG. 17. The second-order digital filter illustrated in FIG. 11 is realized by this filter processing. The specific calculations in the filter processing follow.

First, when the input data (16 bits) is input, temporary TEMP(31-00), NFn_U(15-00), and TEMP(31-00) are determined according to equations (8), (9), and (10).

$$TEMP(31\text{-}00) = NFn\_K(15\text{-}00) \times NFn\text{-}1\_OUT(15\text{-}00) + \quad (8)$$
$$NFn\_E(15\text{-}00) \times NFn\_U1(15\text{-}00) + $$
$$NFn\_F(15\text{-}00) \times NFn\_U2(15\text{-}00)$$

$$NFn\_U(15\text{-}00) = TEMP(29\text{-}14) + TEMP(13) \quad (9)$$

$$\text{TEMP}(31\text{-}00) = \text{TEMP}(31\text{-}00) + \quad (10)$$
$$\text{NFn\_B}(15\text{-}00) \times \text{NFn\_U1}(15\text{-}00) +$$
$$\text{NFn\_C}(15\text{-}00) \times \text{NFn\_U2}(15\text{-}00)$$

After this, the values of internal variables of SA 23 (held in the registers as depicted FIG. 17), that is, the delayed values NFn__U2(15-00) and NFn__U1(15-00), are set by an equation set (11).

$$NFn\_U2(15\text{-}00)=NFn\_U1(15\text{-}00)$$
$$NFn\_U1(15\text{-}00)=NFn\_U(15\text{-}00) \quad (11)$$

Next, output value NFn__OUT(15-00) of the filter is determined from the register values of TEMP according to an equation (12).

$$\text{NFn\_OUT}(15\text{-}00) = \text{TEMP}(29\text{-}14) + \text{TEMP}(13) \text{ (ENABLE}=1) \quad (12)$$
$$= \text{NFn-1\_OUT}(15\text{-}00) \text{ (ENABLE}=0)$$

In particular, notch filter NOTCHm depicted in FIG. 9 is implemented by the type of processing described herein. The presence or absence of the output of the configured notch filter NOTCHn at each servo can be changed freely by the setting of ENABLE depicted FIG. 18.

Dacout Calculation

DACOUT calculation unit 101 of FIG. 9 calculates the servo control output DACOUT with respect to the deviation (CPE). The DACOUT calculation itself is similar to prior methods, however in the present embodiment, the peak filter processing of PEAK0 to PEAK is carried out in parallel with and added to the DACOUT calculation.

Referring now to FIG. 20, there is depicted a block diagram of the registers utilized in the DACOUT calculation. In particular, corresponding offsets, various parameters, processing values, and the like are stored at addresses from 0548 to 056C, as illustrated in FIG. 20.

With reference now to FIG. 21, there is illustrated a block diagram of the registers utilized in the PE prediction calculation. In particular, corresponding coefficients, processing values, and the like are stored at addresses from 0519 to 05F8, as depicted in FIG. 21.

In calculating the DACOUT value, SA 23 performs multiple function. First, SA 23 defines the track on which it wants to hold head 2 as TAR TRK (target track), and calculates the track distance (DST) between this target track and the current track CUR_TRK, the deviation (CPE), the sum (SPE) of the deviations over a plurality of servo patterns (when reproduced), the difference between the deviations of the servo patterns or velocity (CVE), and other parameters as below.

SA 23 takes the absolute value of the upper sixteen bits (D2, D1) of the difference between the current track and target track, that is, the difference in track numbers (CYLID) between the current track and target track, as the track distance DST. SA 23 also takes the lower sixteen bits (D1, D0) of the difference, that is, the lower eight bits of the difference between the track numbers (CYLID) of the current track and the target track and the difference in position within the tracks, as the deviation CPE. The numerical range of this deviation CPE is 8000h to 7FFFh. The SA 23 also takes the absolute value of this deviation CPE as an absolute deviation APE.

SA 23 calculates the track distance DST, deviation CPE, and absolute deviation APE when each servo pattern is reproduced. The SA 23 also retains at least the deviation CPE, determines the sum of the deviations (deviation sum) SPE when a plurality of servo patterns are reproduced, and determines the difference between the deviations of the servo patterns (the velocity) CVE. SA 23 also determines the absolute value of this velocity CVE (absolute velocity) AVE.

Upon calculating parameters as above, SA 23 carries out such processing as selection of the operating mode, deviation prediction, write inhibit control, cylinder ID inference processing, calculation of the sum of the positional deviations (SPE), and other processing according to these parameters. These processes will be described below.

Selection of Operating Mode

It is normally necessary to carry out an optimization of control according to the deviations (CPE, APE) between the position of head 2 and the target track and the velocities (CVE, AVE). Specifically, as depicted in FIG. 14, when a target track is indicated, first, control is executed to accelerate head 2 toward the target sector. Next, when the velocity of motion of head 2 reaches a certain velocity, control is executed to move head 2 at a constant velocity (these modes of acceleration and motion at a constant velocity will be referred to as velocity control modes below). Moreover, when head 2 reaches the vicinity of the target sector, control is executed to decelerate head 2 (the mode in which this type of control is performed will be referred to below as the settling mode). Furthermore, when head 2 reaches the target track, following control is executed to make the head follow the target track (the mode in which this type of control is performed will be referred to below as the track following mode).

In this disk drive device, the regions of values of the absolute deviation APE and absolute velocity AVE are divided into several ranges. In addition, the decision as to which mode to select is made according to the ranges to which the absolute deviation APE and absolute velocity AVE, calculated as above, belong. SA 23 carries out control of the feedback values to the VCM etc. according to the selected mode. For example, in the above-described velocity control mode, the feedback values are gradually increased, and in the settling mode, the feedback values are gradually decreased.

When even one of the absolute deviation and absolute velocity determined as above exceeds a certain criterion, SA 23 inhibits (aborts) read/write processing. Reading and writing on the wrong track can be prevented by performing this type of inhibit processing.

Deviation Prediction and Write Inhibit Processing

In the inhibit processing described above, read/write inhibition was carried out on the basis of the current deviation and velocity, but during writing, in particular, write inhibition is carried out by predicting the position of head 2 when the next servo pattern is reproduced. That is, SA 23 predicts the positional deviation at the next servo pattern from the absolute value of CPE+CVE, and inhibits writing if the absolute value of this predicted value is not within a certain criterion value (PWAC). A suitable value is assigned to the criterion value PWAC as a result of the calculation of the current servo pattern, taking into consideration that the position of the head will be modified by the performance of feedback to the VCM.

Cylinder ID Inference Processing

The cylinder ID (CYLID) can be obtained by reproducing the Gray code in the servo pattern as described above, but when head 2 is moving at high speed, read errors may occur even in the Gray code. If cases like this are simply treated as errors, control of the head position cannot be carried out until the next servo pattern is reproduced. Therefore, SA 23 determines an inter-cylinder velocity (IVE) from the difference between the cylinder IDs when certain adjacent servo patterns are reproduced. When this inter-cylinder velocity IVE exceeds a predetermined criterion velocity (AVC, determined according to the head velocity at which the probability that a Gray code read error will occur becomes high), SA 23 decides that a Gray code read error has occurred, carries out an inference of the cylinder ID, and continues subsequent servo control using this cylinder ID. Servo control can thus continue even if cylinder ID read errors occur temporarily, which can contribute to faster seeking.

Positional Deviation Sum (SPE) Calculation Processing

The sum of the positional deviations (SPE) when the preceding servo patterns were reproduced is employed for determining the servo data for driving the VCM. SA 23 sets an initial value in this SPE at a certain time (for example, when a particular servo pattern is reproduced), then adds the deviation CPE at each servo pattern thereafter.

After executing such processing as the above, SA 23 determines the servo data (CNTIN) for controlling the VCM. This servo data CNTIN is determined as a sum of the deviation CPE, velocity CVE, deviation sum SPE, and values calculated up to the reproduction of the preceding servo pattern, multiplied by suitable coefficients.

The specific calculations in the above DACOUT calculation are as follows.

First, a temporary TEMP(31-00), U(15-00), and CALCOUT1(15-00) are determined from equations (13), (14) and (15). Preferably, Ki, OFFSET, and CENT_OFF are adjustment coefficients.

$$\text{TEMP}(31\text{-}00)=\text{OFFSET}(31\text{-}00)$$
$$+K1(15\text{-}00)\times CPE(15\text{-}00)$$
$$+K2(15\text{-}00)\times CVE(15\text{-}00)$$
$$+K3(15\text{-}00)\times U1(15\text{-}00)$$
$$+K4(15\text{-}00)\times U2(15\text{-}00)$$
$$+K5(15\text{-}00)\times PVE(15\text{-}00)$$
$$+K6(15\text{-}00)\times U3(15\text{-}00)$$
$$+Ki(15\text{-}00)\times SPE(15\text{-}00) \quad (13)$$

$$U(15\text{-}00)=\text{TEMP}(29\text{-}14)+\text{TEMP}(13) \quad (14)$$

$$\text{CALCOUT1}(15\text{-}00)=U(15\text{-}00)+\text{CENT\_OFF}(15\text{-}00) \quad (15)$$

After calculating the values from equations (13), (14) and (15), the values of internal variables (held in SRAM 25) of SA 23, namely PVE(15-00) and the delayed values U3(15-00), U2(15-00), and U1(15-00), are set by an equation set (16).

$$PVE(15\text{-}00)=CVE(15\text{-}00)$$
$$U3(15\text{-}00)=U2(15\text{-}00)$$
$$U2(15\text{-}00)=U1(15\text{-}00)$$
$$U1(15\text{-}00)=1\text{'s complement of }U(15\text{-}00) \quad (16)$$

Saturation checks of the functions in all of the above processing are carried out, and a maximum value such as those provided by equation set (17) is assigned to the delayed value U, for prevention of overflow.

$$\text{Plus overflow}\rightarrow U=7FFF$$
$$\text{Minus overflow}\rightarrow U=8000 \quad (17)$$

The specific calculations in the above-mentioned deviation prediction process are as follows.

In order to perform the specific calculations in the deviation prediction process, first, a temporary TEMP(31-00) and U(15-00) are determined from equation (18). In addition, the absolute value PPWA_VALUE(15-00) of the predicted value is determined from equation (19).

$$\text{TEMP}(31\text{-}00)=\text{TEMP}(31\text{-}00)+KN(15\text{-}00)\times SPE(15\text{-}00)$$

$$\text{TEMP}(31\text{-}00)=KX(15\text{-}00)\times\text{TEMP}(25\text{-}00) \quad (18)$$

$$PPWA\_\text{VALUE}(15\text{-}00)=|CPE+CVE+\text{TEMP}(31\text{-}16)| \quad (19)$$

After performing calculations of equations (18) and (19), writing is inhibited if PPWA_VALUE is not within a certain criterion value (PWAC), according to a formula (20).

$$(SACNTLA.PPW\_ABTN=1) \text{ and } (PPWA\_VALUE>PWAC) \quad (20)$$

→Write abort STATUSA.PPW_ABTED=1

; Next PE prediction write abort

SA 23 executes processing such as multi-stage filter processing on the servo control data DACOUT thus obtained to determine the final data DACOUT to be fed back to the VCM, and supplies it to SIO 22, etc. SIO 22 supplies the DACOUT from SA 23 to the DAC of VCM control unit 6 as serial data. The DAC drives VCM 6 according to the supplied data (DACOUT), controlling the position of head 2.

Specific Example of Digital Filter Configuration

As described above, the filter type, the type of filter inputs and outputs, and so on can be defined freely by setting the bits of the seven sequentially disposed mode select registers Fn_MODE, and the structure of the multi-stage filter can be determined by just one scan of the first bits of the Fn_MODE registers.

Figure 23:
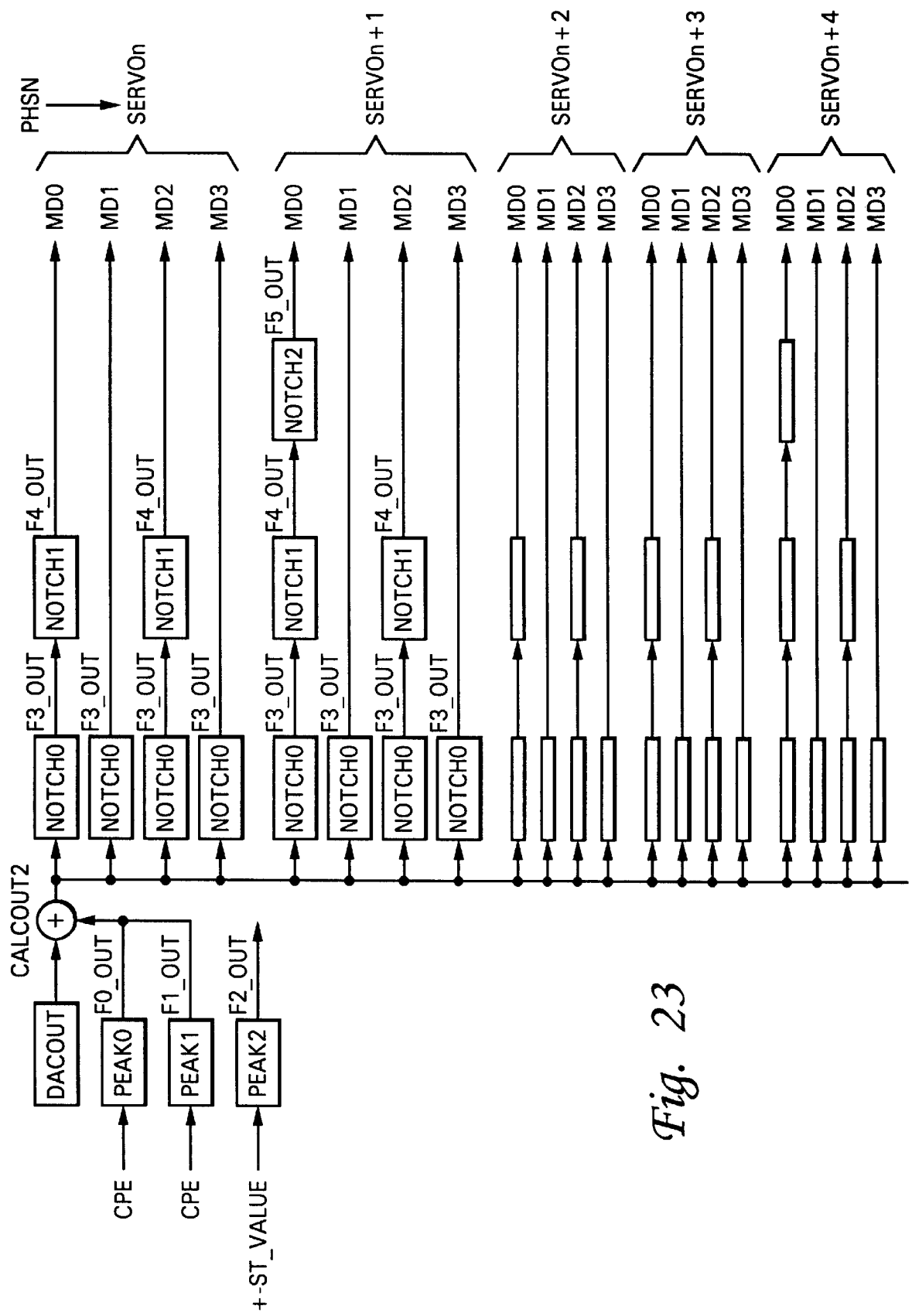
FIG. 23 is a conceptual block diagram of an example of the configuration of a digital filter implemented on hardware logic by settings for describing a specific example of a filter configured with multiple stages, when registers are defined.

Referring now to FIG. 22, there is depicted a chart of a bit structure, for describing a specific example of a filter configured with multiple stages, when Fn_MODE registers are defined. Also, with reference to FIG. 23, there is illustrated a conceptual block diagram of an example of the configuration of a digital filter implemented on hardware logic by settings for describing a specific example of a filter configured with multiple stages, when registers are defined. FIG. 23, incidentally, is expressed with emphasis on component parts of the filter depicted in FIG. 9. The parts referred to, but not depicted in FIG. 23(selectors, adders, and the like) are as in FIG. 9. FIG. 23 also expresses the filter configuration that is configured at each servo (SERVOn, SERVOn+1, SERVOn+2, SERVOn+3, SERVOn+4).

Referring to FIG. 22, in the first bits of F0_MODE to F2_MODE, '0' is set to configure peak filters PEAK0 to PEAK2, while '1' is set in the first bits of F3_MODE to F6_MODE, configuring notch filters NOTCH0 through NOTCH2. In the peak filters PEAK0 through PEAK2, '1' is also set in the fourth bit STSEL of F2_MODE; regarding this filter PEAK2, noise for measurement (ST_VALUE× ST_TGL) is input. Furthermore, '1' is set in the twelfth bit ENABLE of only F0_MODE and F1_MODE; only the outputs of these filters PEAK1 and PEAK2 are output. This condition is depicted by peak filters PEAK0 through PEAK2 on the left side of FIG. 23.

In the notch filters NOTCH0 through NOTCH2, the notch filters configured at each servo (SERVOn, SERVOn+1, SERVOn+2, SERVOn+3, SERVOn+4) differ according to the MD0 through MD3 settings in bits 13 to 16, the BY2, BY3, and BY6 settings in bits 10 to 12, and the FFF setting in the ninth bit. That is, '1' is set in all of MD0 through MD3 in F3_MODE, so there are four (MD0 through MD3) outputs per servo. Also, '101' is set in MD0 through MD3 of F4_MODE, so there are two (MD0, MD2) outputs per server. Also, '0' is set in all of MD0 through MD3 in F5_MODE, and '1' is set in BY3, so there is one output every three servos (SERVOn+1, SERVOn+4). Furthermore, a '1' is set in the final filter flag FFF in the ninth bit of this F5_MODE, so the following filter (F6_MODE) is not processed. This condition is depicted for each servo by the notch filters NOTCH0 through NOTCH2 on the right side in FIG. 23.

Thus in the digital filter in FIG. 23, first, two peak filter stages PEAK0 and PEAK1 are configured. In addition, in SERVOn, notch filters NOTCH0 and NOTCH1 are configured the first time, NOTCH0 is configured the second time, NOTCH0 and NOTCH1 are configured the third time, and NOTCH0 is configured the fourth time. In the next SERVOn+1, NOTCH0, NOTCH1, and NOTCH2 are configured the first time, NOTCH0 is configured the second time, NOTCH0 and NOTCH1 are configured the third time, and NOTCH0 is configured the fourth time. The following SERVOn+2 and SERVOn+3 have the same filter configuration as SERVOn; next, SERVOn+4 has the same filter configuration as SERVOn+1, and the pattern above is repeated at subsequent servos.

In the example depicted in FIG. 23, SA 23 executes the processing up to the production of the above servo data only once per servo pattern. In executing the filter processing, SA 23 outputs the first DACOUT. After this, SA 23 immediately carries out the filter processing for the second DACOUT, and waits until there is a request for DACOUT from the timer that measures the DACOUT interval. When there is a DACOUT request from the timer, it outputs the calculated DACOUT, and repeats similar processing the specified number of times. DACOUT can thereby be output at intervals of one-fourth the interval of the servo patterns.

If this example is viewed on the timing diagram in FIG. 6, reference line (f), the servo calculations necessary the first time are the DACOUT calculation and the above peak filter and notch filter calculations. The results of these calculations are output the first time. The second time and subsequent times, only the specified notch filter calculations are carried out, so the amount of calculations is much less than the first time.

As has been described, a disk drive device according to the present embodiment comprises an SA 23, which is hardware logic assisting in positioning control of the head arm actuator. In addition, SA 23 comprises seven mode select registers Fn_MODE that are definable as either peak or notch filters. The Fn_MODE registers are 16-bit registers having a sequential structure, being disposed in sequence from F0_MODE to F6_MODE. Further, the Fn_MODE registers are constituted such that the filter type and the inputs and outputs of the filters are defined by bit settings, in order that a multi-purpose programmable digital filter can be configured, with multiple stages of specified types, by a sequencer that easily discriminates the bits of the Fn_MODE registers.

Thereby, the filter assignments can be changed freely in this way. For example, it is easily possible to bring one serial-side filter over to the parallel side and provide it with the functions of a peak filter. In this case, it suffices to provide the same server system logic, and to specify with microcode what type of selections this logic is to make.

In particular, in the small actuators employed in hard disks with a form factor of one inch or less, repeatable disturbances caused by the eccentricity of the disk and the like become a problem because the disk is very thin. Therefore, about three peak filters are preferably utilized, while as for notch filters, one, or none, is utilized. In the actuators employed in large hard disks with a 3.5-inch form factor, mechanical resonant frequencies are more of a problem than disturbances, and it suffices to have two peak filters (in practice, one is sufficient), but at least three notch filters are preferably utilized. In the past, because the characteristics of the filters required for controlling the head actuator of disk devices of different sizes differed as described above, it was necessary to design logic including filter characteristics corresponding to the hardware (in practice, to try manufacturing it, or to design it with microcode). In the present embodiment, however, the configuration of the filter can be changed to suit the purpose, because there is a degree of freedom in the configuration of the digital filter, and it can be speedily applied to all types of positioning control devices.

The present embodiment also provides a method for generating noise for frequency-characteristic measurements and inserting the generated noise into the filter configured by the Fn_MODE register specifications, such that the frequency characteristics of the actuator may be measured without employing a microprocessor or tester, and the filter coefficients may be self-tuned in real time. For example, if a square wave divided from a crystal (as one example, a 1, 0 signal, the division ratio of the crystal being variable in 25-Hz steps) is input to the peak filters instead of CPE input, the input becomes sine-wave noise, only if coefficients that make the peak characteristic frequency match the frequency of the sine wave are set up. Thereby, sine-wave noise can be generated easily.

Also, a disk drive device according to the present embodiment scarcely increases the processing load on MPU 40 at all, because filtering processing can be carried out by an SA independent of an MPU.

Thus, in the present embodiment, it has become possible to change the method of inserting filters with a multi-stage configuration freely, and also to change the filters configured at each servo. A case in which the configured filters and filter characteristics were switched at every servo has been described, but it is also permissible to set a peak filter as part of a particular process timing, for example, error recovery processing.

Moreover, the Fn_MODE registers are 16-bit registers having a sequential structure, and can implement all manner of patterns with sixteen bits. Moreover, they can be implemented by bit decisions, in an extremely simple configuration, for a sequencer, as the sequencer only sees the sequence.

In the present embodiment, an example that applied the invention to an HDD was described. However, in alternate embodiments, the present invention can be applied to CD-ROM drives, DVD drives, and devices of any other type, provided that the application is to a digital filter and a servo control device, and frequency characteristics need to be controlled.

Also, in the present embodiment, at least one peak filter and at least one notch filter were configured on the hardware, but it is not absolutely necessary to use this type of configuration scheme. The filter configuration example is only one example.

Also, in the present embodiment, peak filters were employed as the filters of the parallel type and notch filters were employed as the filters of the serial type, but the types of these filters are not restricted. For example, low-pass filters can be employed for the filters of the serial type. That is, a second-order IIR filter in a configuration with a serial connection can be a notch filter, a low-pass filter, or a low-pass filter having a notch characteristic, depending on the selection of coefficients. Depending on the characteristics of the actuator, there are cases in which it is better to provide low-pass characteristics, and in examples of actual product applications, it is also possible to use notch filters having a low-pass characteristic.

Furthermore, the type and number etc. of the MPU, HDC, and the like in the above disk drive device are, needless to say, not limited to the embodiment described above.

While the invention has been particularly shown and described with reference to a preferred embodiment, it will be understood by those skilled in the art that various changes in form and detail may be made therein without departing from the spirit and scope of the invention.

What is claimed is:

1. A digital filter, comprising:
    a plurality of selectable filter modules, wherein each of said plurality of selectable filter modules functions in a serial or parallel filtering mode when selected;
    a plurality of configurable registers, wherein the configuration of each of said plurality of configurable registers determines a selection of at least one of said plurality of selectable filter modules, wherein said plurality of configurable registers comprise a plurality of mode selection registers switchable in different modes, wherein said plurality of mode selection registers comprise bits specifying at least a filter type and an output state as configured by an input interface;
    an input interface, coupled to said plurality of configurable registers, that configures said plurality of configurable registers in response to configuration inputs, such that a predetermined filter structure is dynamically configured; and
    a sequencer for discriminating said bits of said plurality of mode selection registers, wherein said selection of at least one of said plurality of selectable filter modules comprises only those selectable filter modules selected by said discriminated bits.

2. The digital filter according to claim 1, wherein:
    said plurality of selectable filter modules comprises a plurality of second-order IIR digital filters.

3. The digital filter according to claim 1, said plurality of selectable filter modules further comprising:
    a delay element that delays an external input to each of said plurality of selectable filters by a unit time;
    a coefficient setting element that dynamically sets a plurality of filter coefficients for each of said plurality of selectable filters;
    a selection element that selects either the external filter input or the output of said delay element for input to said selectable filter; and
    an adder that calculates a filter output by adding two of the filter input, the output of said delay element, and the output of said coefficient setting element.

4. The digital filter according to claim 1, said plurality of selectable filter modules further comprising:
    at least one filter module configured for disturbance suppression; and
    at least one filter module configured for mechanical resonance suppression.

5. The digital filter according to claim 1, said plurality of selectable filter modules further comprising:
    a peak filter module configured for a peak gain at a particular frequency; and
    a notch filter module configured for removing a particular frequency component from the filter input or filter output.

6. The digital filter according to claim 1, wherein said plurality of selectable filter modules comprise a plurality of low-pass filters for removing frequencies higher than a certain frequency.

7. A digital filter utilized for actuator positioning control in a disk device, said digital filter comprising:
    a plurality of selectable filter modules, wherein each of said plurality of selectable filter modules functions in a serial or parallel filtering mode when selected;
    a plurality of configurable registers, wherein the configuration of said plurality of configurable registers determines a selection of at least one of said plurality of selectable filter modules; and
    an input interface, coupled to said plurality of configurable registers, that configures said plurality of configurable registers in response to configuration inputs, such that a digital filter for controlling stable actuator positioning for a disk drive device is dynamically configured.

8. The digital filter according to claim 7, wherein:
    said plurality of selectable filter modules comprise at least one filter of parallel type and at least one filter of serial type, with respect to a position error signal input to said digital filter.

9. The digital filter according to claim 7, wherein:
    said plurality of selectable filter modules comprise sequentially configured selectable filter modules, sequentially configured by first configuring selectable filter modules of parallel type, then configuring selectable filter modules of serial type, with respect to a position error signal input to said digital filter.

10. The digital filter according to claim 7, wherein:
    said selection of said plurality of selectable filters modules comprises alternate selections for each of a plurality of actuators of a disk drive device.

11. The digital filter according to claim 7, said plurality of selectable filter modules further comprising:
    a delay element that delays an external input to each of said plurality of selectable filters by a unit time;
    a coefficient setting element that dynamically sets a plurality of filter coefficients for each of said plurality of selectable filters;
    a selection element that selects either the external filter input or the output of said delay element for input to said selectable filter; and
    an adder that calculates a filter output by adding two of the filter input, the output of said delay element, and the output of said coefficient setting element.

12. The digital filter according to claim 7, wherein:
    the inputs and outputs of said selection of said plurality of selectable filters modules comprise inputs and outputs which are alterable at particular control timings.

13. The digital filter according to claim 7, said digital filter further comprising:
    a frequency-variable square-wave pulse element that generates a square-wave pulse;
    a noise element that generates noise for measuring frequency characteristics from the output of said square-wave pulse element, wherein frequency characteristics of an actuator comprise frequency characteristics measurable by input of said noise generated for measurement by said noise element to said selection of said plurality of selectable filter modules.

14. The digital filter according to claim 13, wherein:

a plurality of coefficients dynamically set for each of said selected filter modules comprise a plurality of coefficients dynamically alterable according to results of measurement of said frequency characteristics of said actuator.

15. The digital filter according to claim 7, wherein:

said plurality of selectable filter modules comprise a plurality of second-order IIR digital filters.

16. The digital filter according to claim 7, wherein:

said plurality of configurable registers comprise a plurality of mode selection registers switchable in different modes;

said plurality of mode selection registers comprise bits specifying at least a filter type and an output state; and said bits of said plurality of mode selection registers comprise bits configured by said input interface.

17. The digital filter according to claim 7, further comprising:

a sequencer for discriminating said bits of said plurality of mode selection registers, wherein said selection of at least one of said plurality of selectable filter modules comprises only those selectable filter modules selected by said discriminated bits.

18. The digital filter according to claim 7, said plurality of selectable filter modules further comprising:

at least one filter module selectable for disturbance suppression; and at least one filter module selectable for mechanical resonance suppression.

19. The digital filter according to claim 7, said plurality of selectable filter modules further comprising:

a peak filter module that provides a peak gain at a particular frequency; and a notch filter module that removes a particular frequency component from the filter input or filter output.

20. A disk drive device, comprising:

a disk-shaped recording medium comprising a plurality of servo areas comprising recorded servo sectors and a plurality of data areas comprising recorded data sectors;

a head element that records and reproduces said servo areas and said data areas;

a motor for controlling the position of said recording and reproducing means;

a controller for performing control of recording and reproduction of said data sectors by said head element;

a positional information extraction element that extracts positional information indicating a position of said head element from the reproduced output of said servo sectors reproduced by said head element;

a servo calculation element that calculates servo data for driving said motor according to the positional information extracted by said positional information extraction element; and a digital filter for performing filtering of said servo data determined by said servo calculation element, wherein said digital filter comprises:

a plurality of selectable filter modules, wherein each of said plurality of selectable filter modules functions in a serial or parallel filtering mode when selected;

a plurality of configurable registers, wherein the configuration of each of said plurality of configurable registers determines a selection of at least one of said plurality of selectable filter modules; and an input interface, coupled to said plurality of configurable registers, that configures said plurality of configurable registers in response to configuration inputs, such that a digital filter for controlling stable head positioning of a disk drive device is dynamically configured.

* * * * *

UNITED STATES PATENT AND TRADEMARK OFFICE
CERTIFICATE OF CORRECTION

PATENT NO. : 6,567,230 B1
DATED : May 20, 2003
INVENTOR(S) : Naoyuki Kagami et al.

It is certified that error appears in the above-identified patent and that said Letters Patent is hereby corrected as shown below:

Column 7,
Line 10, delete the letter "O" between "is" and "supplied".
Lines 38 and 39, replace the word "Wi" with the word -- W1 --.

Column 10,
Line 7, delete the letter "o" between "in" and "the".

Column 11,
Line 20, replace the word "PEAK" with the word -- PEAKn --.

Column 13,
Line 36, replace the word "FL_" with the word -- F1_ --.
Line 49, replace the word "055SE" with the word -- 055E --.

Column 14,
Lines 15 and 17, replace the word "PEAK" with the word -- PEAKn --.

Column 15,
Lines 20, 22 and 37, replace the word "PEAK" with the word -- PEAKn --.

Column 17,
Line 36, replace the word "PEAK" with the word -- PEAKn --.

UNITED STATES PATENT AND TRADEMARK OFFICE
CERTIFICATE OF CORRECTION

PATENT NO.   : 6,567,230 B1
DATED        : May 20, 2003
INVENTOR(S)  : Naoyuki Kagami et al.

It is certified that error appears in the above-identified patent and that said Letters Patent is hereby corrected as shown below:

<u>Column 25,</u>
Line 30, replace entire claim 18 to read as follows:
-- 18. The digital filter according to Claim 7, said plurality of selectable filer modules further comprising:

a delay element that delays an external input to each of said plurality of selectable filters by a unit time;

a coefficient setting element that dynamically sets a plurality of filter coefficients for each of said plurality of selectable filers;

a selection element that selects either the external filter input or the output of said delay element for input to said selectable filter; and an adder that calculates a filter output by adding two of the filter input, the output of said delay element, and the output of said coefficient setting element. --

Signed and Sealed this

Twenty-first Day of October, 2003

JAMES E. ROGAN
*Director of the United States Patent and Trademark Office*